(12) United States Patent
Luttikhuis et al.

(10) Patent No.: US 7,483,120 B2
(45) Date of Patent: *Jan. 27, 2009

(54) DISPLACEMENT MEASUREMENT SYSTEM, LITHOGRAPHIC APPARATUS, DISPLACEMENT MEASUREMENT METHOD AND DEVICE MANUFACTURING METHOD

(75) Inventors: Bernardus Antonius Johannes Luttikhuis, Nuenen (NL); Henrikus Herman Marie Cox, Eindhoven (NL); Erik Roelof Loopstra, Heeze (NL); Engelbertus Antonius Fransiscus Van Der Pasch, Oirschot (NL); Harmen Klaas Van Der Schoot, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 273 days.

This patent is subject to a terminal disclaimer.

(21) Appl. No.: 11/430,196

(22) Filed: May 9, 2006

(65) Prior Publication Data

US 2007/0263197 A1 Nov. 15, 2007

(51) Int. Cl.
*G03B 27/42* (2006.01)
*G03B 27/58* (2006.01)
*G01B 11/14* (2006.01)

(52) U.S. Cl. .................. 355/53; 355/72; 356/616

(58) Field of Classification Search ............... 355/52, 355/53, 55, 72; 356/490, 616
See application file for complete search history.

(56) References Cited

U.S. PATENT DOCUMENTS

| | | | |
|---|---|---|---|
| 5,142,146 A | 8/1992 | Morokuma | |
| 5,610,715 A | 3/1997 | Yoshii et al. | |
| 5,757,507 A | 5/1998 | Ausschnitt et al. | |
| 5,801,832 A | 9/1998 | Van Den Brink | |
| 5,942,357 A | 8/1999 | Ota | |
| 5,969,441 A | 10/1999 | Loopstra et al. | |
| 6,341,007 B1 | 1/2002 | Nishi et al. | |
| 6,417,914 B1 | 7/2002 | Li | |
| 6,781,694 B2 | 8/2004 | Nahum et al. | |
| 6,875,992 B2 | 4/2005 | Castenmiller et al. | |
| 7,161,659 B2 | 1/2007 | Van Den Brink et al. | |
| 2003/0076482 A1 | 4/2003 | Inoue | |
| 2004/0263846 A1 | 12/2004 | Kwan | |
| 2005/0122490 A1* | 6/2005 | Luttikhuis et al. | 355/30 |

(Continued)

FOREIGN PATENT DOCUMENTS

EP 1 111 471 A2 6/2001

(Continued)

OTHER PUBLICATIONS

Marinus Van Den Brink et al., "Dual Stage Lithographic Apparatus and Device Manufacturing Method", U.S. Appl. No. 11/101,631, filed Apr. 8, 2005 (now Abandoned).

(Continued)

*Primary Examiner*—Diane I Lee
*Assistant Examiner*—Steven H Whitesell-Gordon
(74) *Attorney, Agent, or Firm*—Sterne, Kessler, Goldstein & Fox, P.L.L.C.

(57) ABSTRACT

A displacement measurement system, in particular for measuring the displacement of a substrate table in a lithographic apparatus relative to a reference frame is presented. The displacement measure system includes a plurality of displacement sensors mounted to the substrate table and a target associated with each displacement sensor mounted to the reference frame.

23 Claims, 20 Drawing Sheets

U.S. PATENT DOCUMENTS

| | | |
|---|---|---|
| 2005/0168714 A1 | 8/2005 | Renkens et al. |
| 2005/0178976 A1 | 8/2005 | Steele |
| 2005/0237510 A1 | 10/2005 | Shibazaki |
| 2006/0061747 A1 | 3/2006 | Ishii |
| 2006/0227309 A1* | 10/2006 | Loopstra et al. ............... 355/53 |

FOREIGN PATENT DOCUMENTS

| | | |
|---|---|---|
| EP | 1 220 037 A2 | 7/2002 |
| EP | 1 486 827 A2 | 12/2004 |
| EP | 1 486 827 A3 | 12/2004 |
| EP | 1 510 870 A1 | 3/2005 |
| EP | 1 635 382 A1 | 3/2006 |
| JP | 10-318791 A | 4/1998 |
| WO | WO 2004/114380 A1 | 12/2004 |

OTHER PUBLICATIONS

Schaffel et al. "Integrated electro-dynamic multicoordinate drives," Proc. ASPE Annual Meeting, California, USA, 1996, pp. 456-461.

Dey, Jim, "Precision wafer stepper utilizing a two-dimensional optical encoder", SPIE vol. 275, Semiconductor Lithography VI (1981) pp. 29-34.

* cited by examiner

Fig. 7a
Fig. 7b
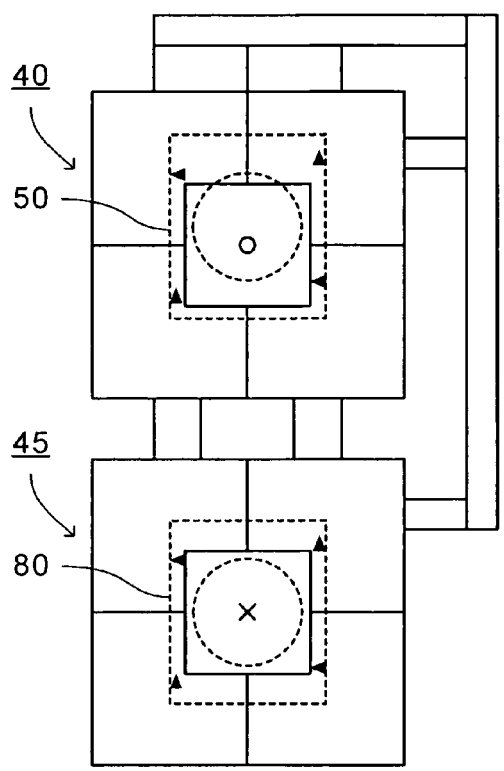
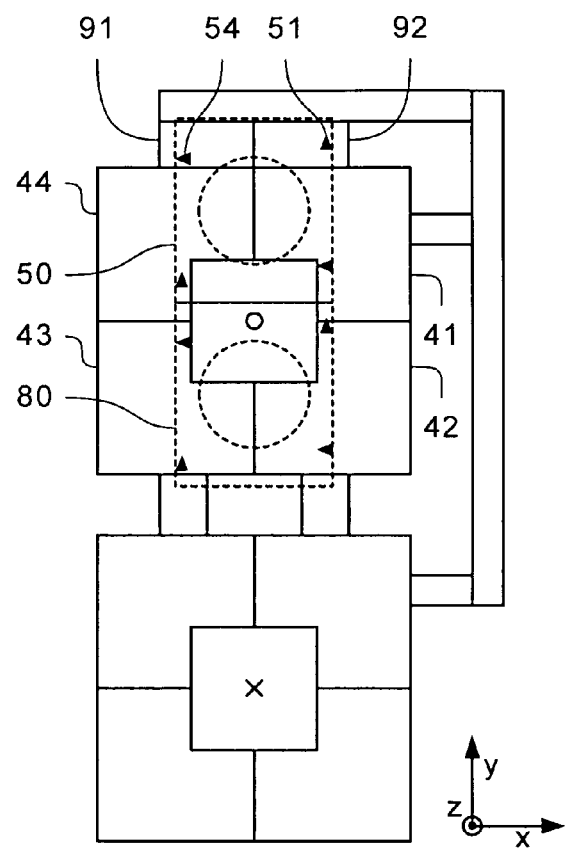

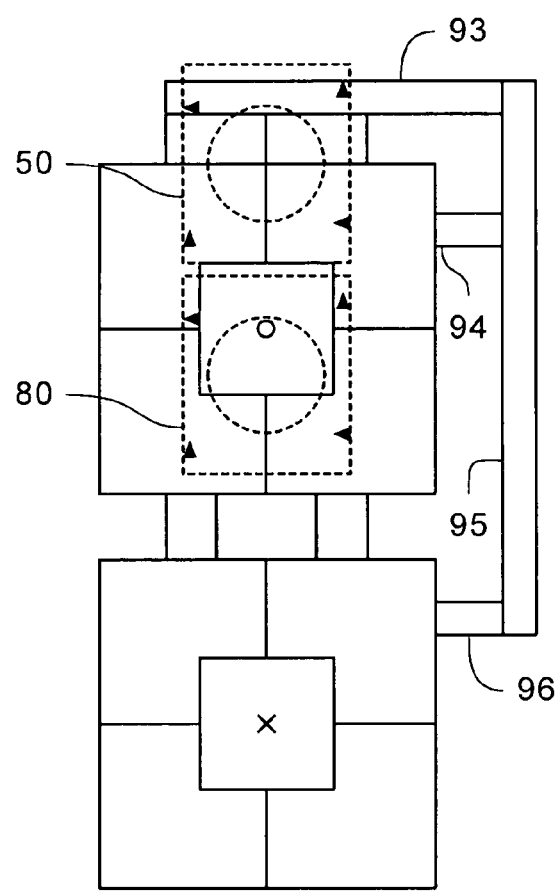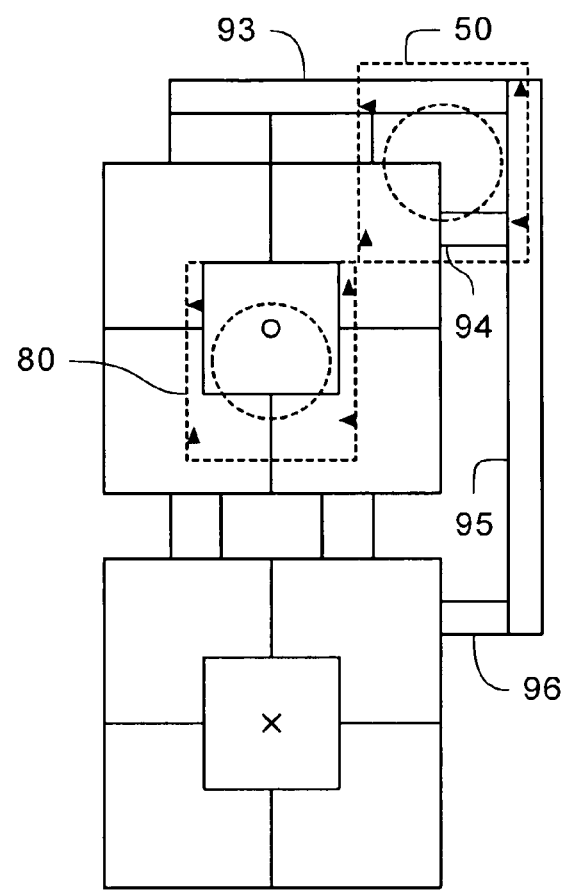

Fig. 7e
Fig. 7f
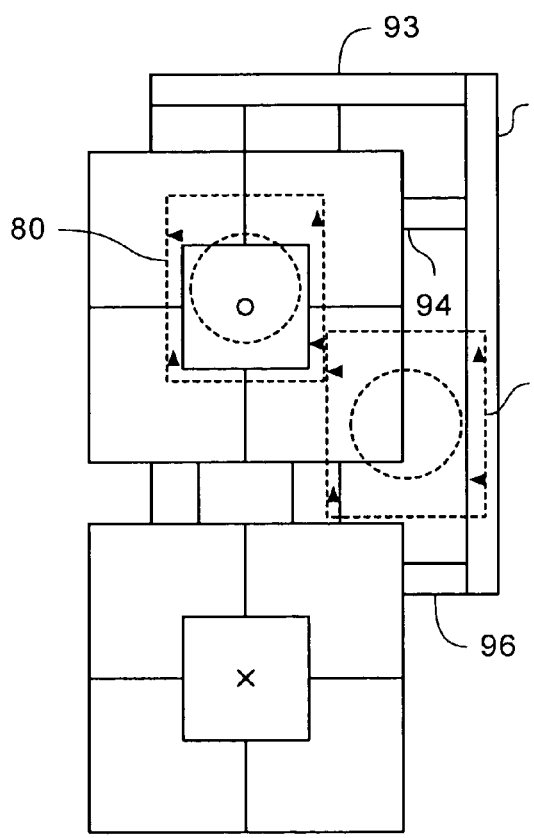
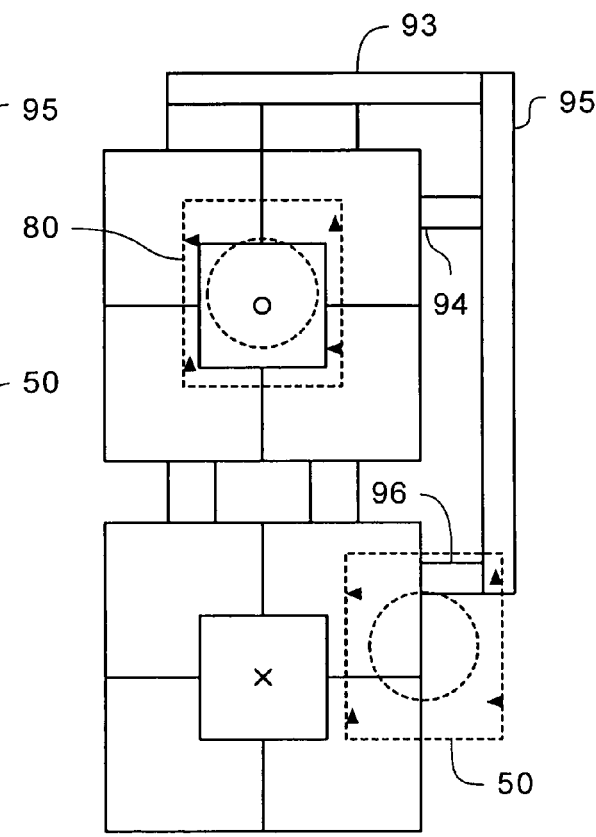

Fig. 7g
Fig. 7h
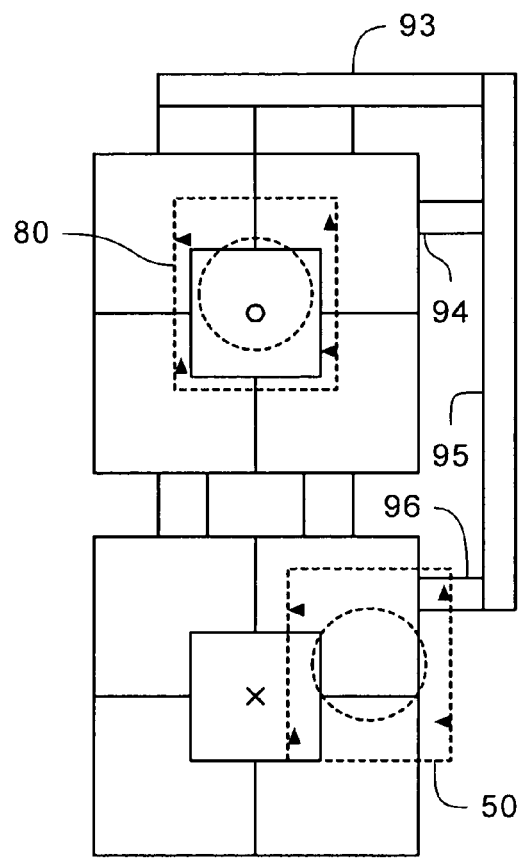
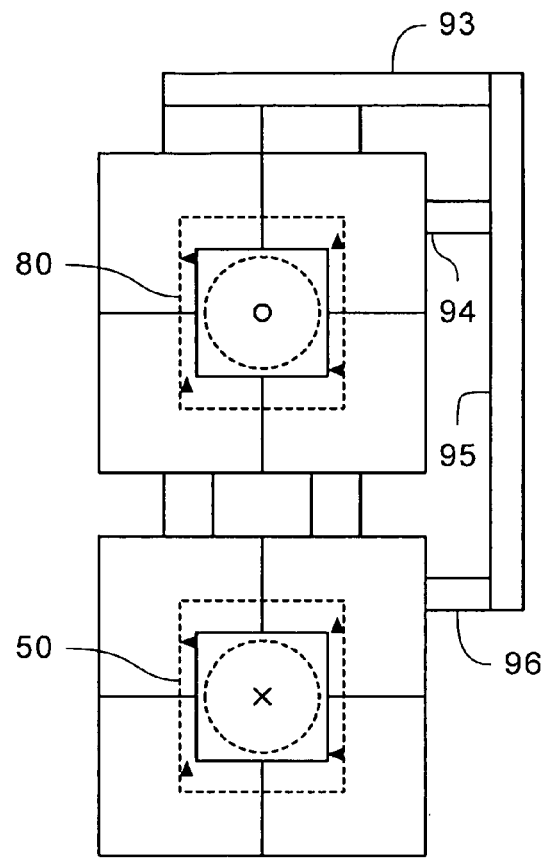

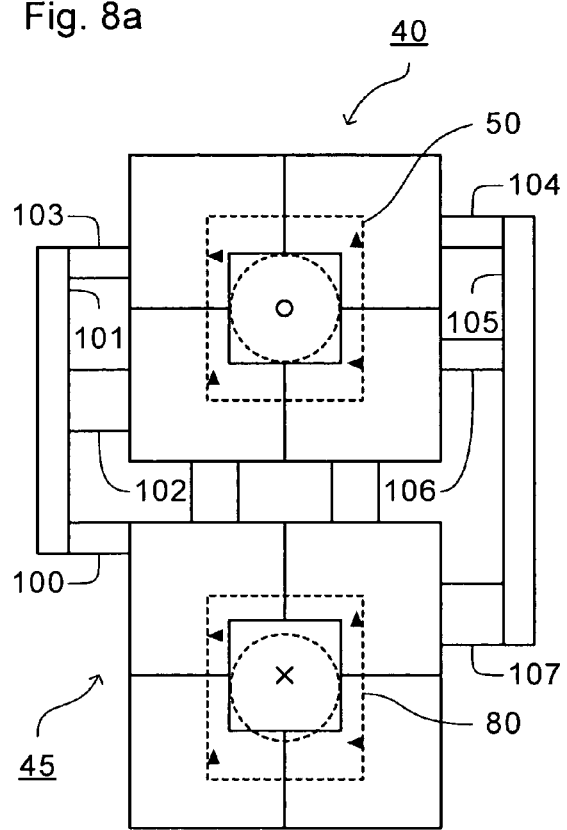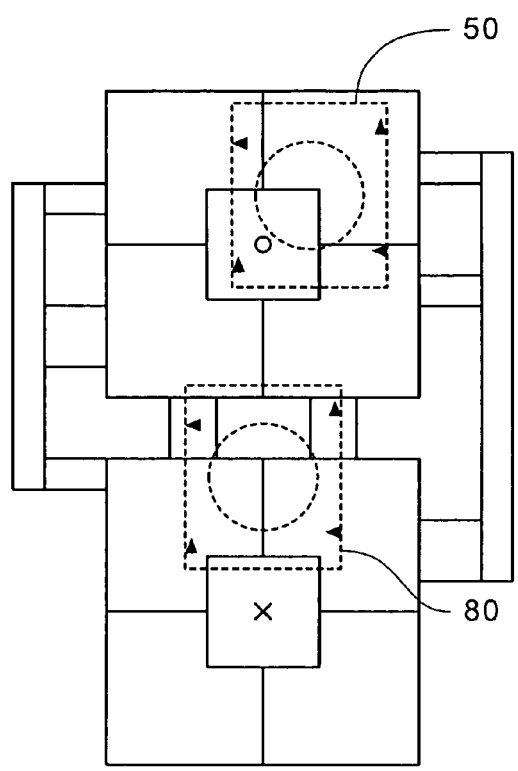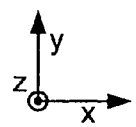

Fig. 9a
Fig. 9b
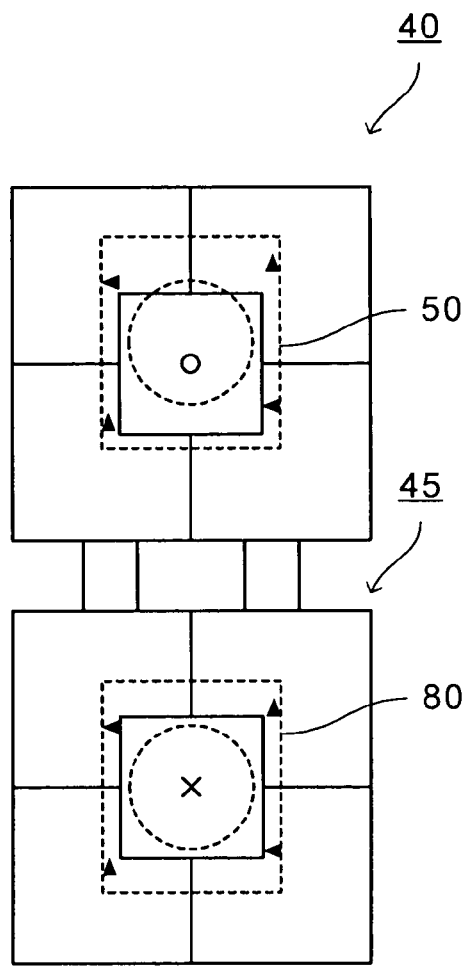
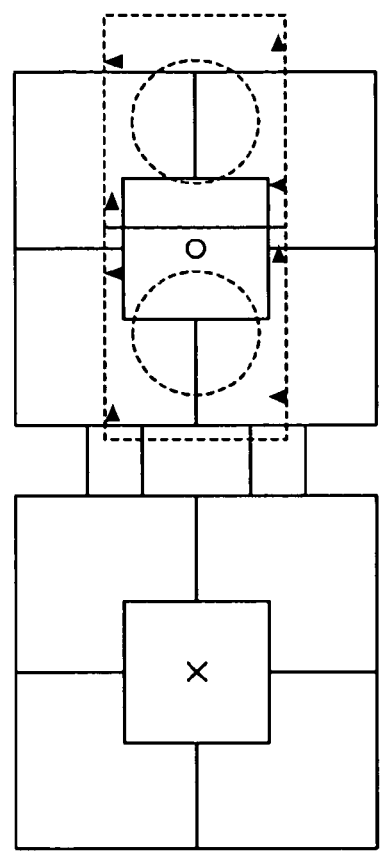
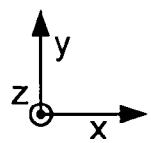

Fig. 9g
Fig. 9h
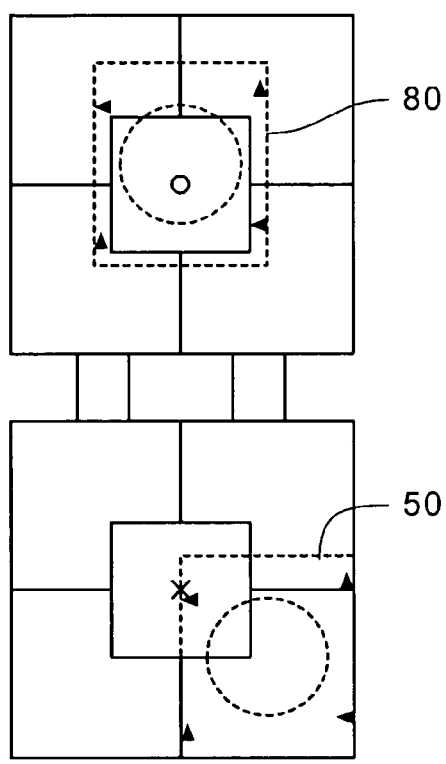
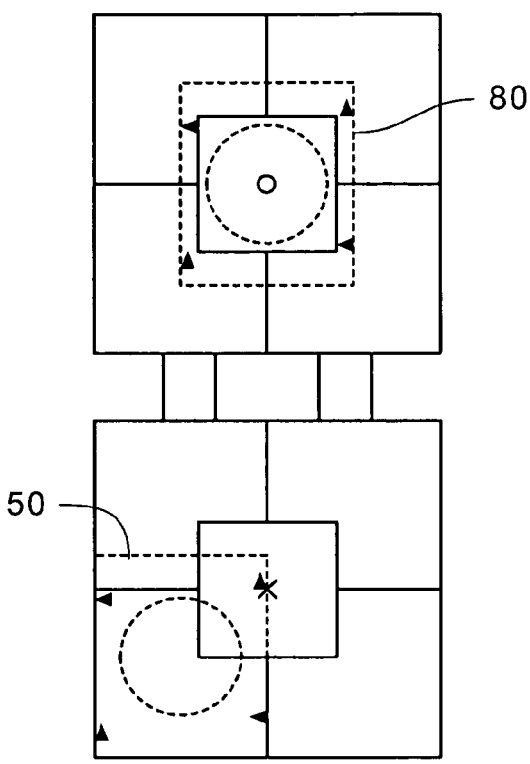

DISPLACEMENT MEASUREMENT SYSTEM, LITHOGRAPHIC APPARATUS, DISPLACEMENT MEASUREMENT METHOD AND DEVICE MANUFACTURING METHOD

FIELD

The present invention relates to a displacement measurement system, lithographic apparatus utilizing such a system, a displacement measurement method and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithographic apparatus, the substrate may typically be supported on a substrate table. Prior to the transfer of the pattern to the substrate, the substrate may be inspected and/or measured in a metrology area. Subsequently, the substrate is transferred by the substrate table to an area in which the pattern is transferred to the substrate. In order to ensure that the pattern that is transferred to the substrate is accurately positioned relative to the substrate and/or other patterns already formed on the substrate, it is desirable to know the position and movement of the substrate during the measurement and/or inspection process and during the image transfer process to a high degree of accuracy. This may be achieved by measuring the position of the substrate relative to the substrate table on which it is supported and subsequently monitoring the position and/or movement of the substrate table.

In order to measure the position and/or movement of the substrate table, known systems typically utilize a target mounted on one of the substrate table and a reference frame of the lithographic apparatus and a sensor mounted on the other of the substrate table and the reference frame that can measure the position or movement of the target relative to the sensor. However, the desired range of movement of the substrate table is relatively large because the substrate table should be able to move between an area in which any part of the substrate can be measured and/or inspected and an area in which a pattern may be transferred to any part of the substrate. Furthermore, in some lithographic apparatus, two substrate tables are provided such that while one substrate, supported on a first substrate table is having a pattern transferred to it, another substrate, supported on the second substrate table may be being inspected and/or measured. In such apparatus, the desired range of movement of the substrate tables is even larger because additional space is provided such that the substrate table supporting a substrate that is being inspected and/or measured can be transferred to the area in which a pattern may be transferred to the substrate and the substrate table supporting the substrate that has had a pattern transferred to it should be able to move successively to a position in which the substrate is unloaded from the substrate table, a position in which a new substrate is loaded to the substrate table and a position in which the new substrate is inspected and/or measured. In other words, the two substrate tables should be capable to swap over.

The larger the range of movement of the substrate table, the harder and/or more expensive it becomes to provide a system to measure the position and/or movement of the substrate table to the desired high level of accuracy. In particular, in systems in which the target for the position sensor is mounted to the substrate table, the larger the range of movement, the more complicated the system and the more difficult it becomes to maintain the desired accuracy. For systems in which the target is static and mounted to, for example, the reference frame, the larger the range of movement of the substrate table, the larger the target should be. Providing large targets may be expensive because it is generally difficult to make large targets that have the desired accuracy over their full range. Accordingly, increasing the range of movement of the substrate table, significantly increases the cost of the system to measure the position and/or movement of the substrate table.

SUMMARY

It is desirable to provide a system that may be used to measure accurately the position and/or movement of a substrate table over a large range of movements without excessive cost.

According to an embodiment of the invention, there is provided a displacement measurement system configured to measure the displacement of a component relative to a reference component, including: first, second, third and fourth targets, each mounted to the reference component and arranged such that a target surface of each target is substantially parallel to a reference plane; and first, second, third and fourth displacement sensors, each arranged to measure the displacement of a respective part of the component relative to the target surface of a respective target; wherein the first and third displacement sensors are configured to measure the displacement of first and third parts of the component relative to the target surfaces of the first and third targets, respectively, substantially parallel to a first direction that lies within the reference plane; and the second and fourth displacement sensors are configured to measure the displacement of second and fourth parts of the component relative to the target surfaces of the second and fourth targets, respectively, substantially parallel to a second direction that lies within the reference plane and is substantially orthogonal to the first direction.

According to an embodiment of the invention, there is provided a lithographic apparatus, including a substrate table constructed to support a substrate; and a displacement measuring system configured to measure the displacement of the substrate table relative to a reference component during a process to transfer a pattern to the substrate; wherein the displacement measuring system includes at least one target mounted to the reference component and at least one displacement sensor configured to measure the displacement of at least a part of the substrate table relative to the at least one target; and the lithographic apparatus further includes a second displacement measuring system that is configured to measure the displacement of the substrate table relative to a base frame of the lithographic apparatus, at least during a part of a substrate table return movement, in which the substrate table is moved from a position at which the pattern may be transferred to the substrate, to an unload position, at which a substrate may be unloaded from the substrate table.

According to an embodiment of the invention, there is provided a method of measuring the displacement of a component relative to a reference component, including using first, second, third and fourth displacement sensors to measure the displacement of a respective part of the component relative to a target surface of a first, second, third and fourth target, respectively; wherein the first, second, third and fourth targets are mounted to the reference component and arranged such that each of the target surfaces is substantially parallel to a reference plane; the first and third displacement sensors measure the displacement of the first and third parts of the component relative to the target surface of the first and third targets, respectively, substantially parallel to a first direction that lies within the reference plane; and the second and fourth displacement sensors measure the displacement of the second and fourth parts of the component relative to the target surfaces of the second and fourth targets, respectively, substantially parallel to a second direction that lies within the reference plane and is substantially orthogonal to the first direction.

According to an embodiment of the invention, there is provided a device manufacturing method including transferring a pattern from a patterning device onto a substrate, wherein the substrate is supported on a substrate table during the process to transfer the pattern to the substrate; and during the process, the displacement of the substrate table relative to a reference component is measured using a displacement measuring system including at least one target mounted to the reference component and at least one displacement sensor, configured to measure the displacement of at least a part the substrate table relative to the at least one target; and measuring the displacement of the substrate table relative to a base frame of the lithographic apparatus, at least during a part of a substrate table return movement, in which the substrate table is moved from a position in which the pattern is transferred to the substrate, to an unload position, at which the substrate is unloaded from the table.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7a to 7h depict an arrangement of a lithographic apparatus according to an embodiment of the present invention;

FIGS. 8a to 8h depict a variant of the lithographic apparatus according to an embodiment; and FIGS. 9a to 9h depict the arrangement of a lithographic apparatus according to an embodiment of the present invention.

DETAILED DESCRIPTION

Figure 1:
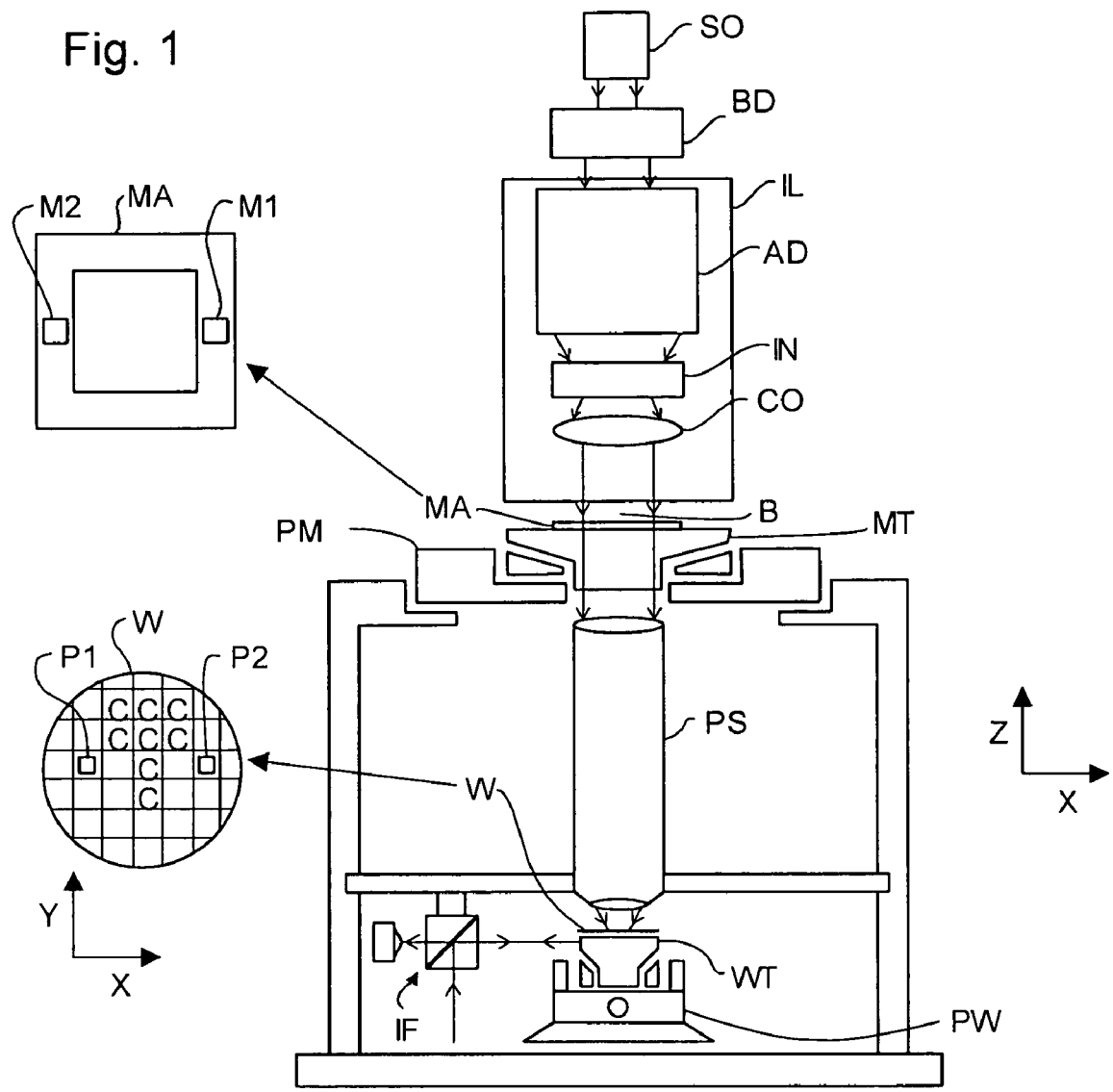
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
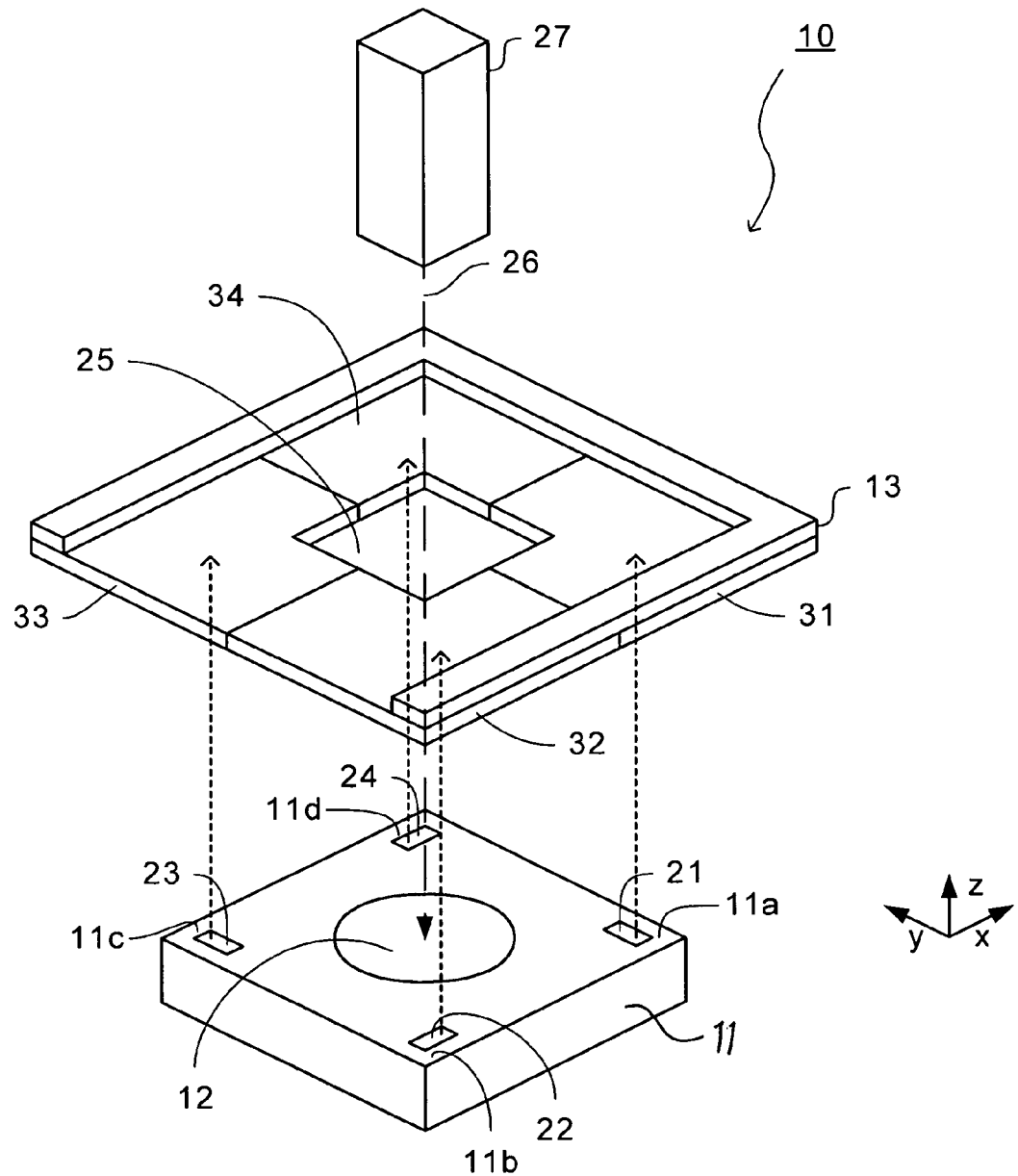
FIG. 2 depicts the configuration of a displacement measurement system according to an embodiment of the present invention.

FIG. 2 depicts a displacement measurement system 10, according to an embodiment of the invention. As depicted and as discussed below, all displacement measurement systems according to the embodiments of the present invention may, in particular, be used to measure the displacement of a substrate table within a lithographic apparatus. However, although not described in detail below, embodiments of the invention may also be used to measure the displacement of a support for a patterning device in a lithographic apparatus.

The measurement of the displacement of a component within a lithographic apparatus may be used in order to control the movement of that component. For example, a feedback control loop for an actuator configured to move a component may compare the actual displacement of the substrate table measured by the displacement measurement system, with an intended displacement and apply the desired forces to the component in order to minimize the difference. Furthermore, it should be appreciated that embodiments of the invention may also be applied in other circumstances and may, in general, be used to measure the displacement of a component within any system relative to a reference component.

In the arrangement depicted, the displacement measurement system 10 can be used to measure the displacement of a substrate table 11, configured to support a substrate 12, relative to a reference frame 13. The displacement measurement system 10 may be provided within a region of a lithographic apparatus within which, for example, a pattern is to be transferred to the substrate 12, for example by exposure with a patterned beam of radiation. Alternatively, for example, the displacement measurement system 10 may be provided within a part of the lithographic apparatus within which the substrate 12 is inspected and/or measured, namely a metrology unit.

In order to measure the displacement of the substrate table 11 relative to the reference frame 13, a plurality of displacement sensors 21,22,23,24 are provided that measure the displacement of a corresponding part 11a,11b,11c,11d of the substrate table 11 relative to a respective target 31,32,33,34 that is mounted to the reference frame 13. This arrangement, in which separate targets mounted to the reference frame are used for each displacement sensor instead of using a single, large, target mounted to the reference frame enables the provision of a large range of movement for the substrate table without any single target becoming excessively large. It should be appreciated that in order to provide sufficient accuracy, the targets have as few defects as possible. However, the larger the target, the more difficult, and therefore the more expensive, it is to manufacture the target with a sufficiently low defect rate. Accordingly, the cost of a single large target is significantly greater than the cost of a plurality of smaller targets having, in combination, the same area as the large target.

The displacement sensors 21,22,23,24 may, for example, be diffraction grating encoders. In such an arrangement, a beam of radiation may be divided by a reference grating into first order and negative first order diffracted radiation that is subsequently further diffracted by a target diffraction grating and then recombined to form a single beam of radiation. By comparing the phase difference between radiation in the recombined beam of radiation derived from the first order radiation and that derived from the negative first order radiation, it is possible to measure the displacement of the target diffraction grating relative to the reference diffraction grating in a direction that lies within a plane substantially parallel to the planes of the reference and target diffraction gratings and is substantially perpendicular to the striations of the reference and target diffraction gratings. Other displacement sensors may alternatively or additionally be used.

Furthermore, in such an arrangement, by comparing the path length of zero order radiation from the reference diffraction grating and at least one of the first order and negative first order diffracted radiation from the reference grating that is reflected or further diffracted back from the target diffraction grating, it is possible to measure the displacement of the target diffraction grating relative to the reference diffraction grating in a direction substantially perpendicular to the plane of the diffraction grating. Other arrangements may alternatively or additionally be used to measure the relative displacement of the gratings in the direction perpendicular to the plane of the diffraction gratings.

Accordingly, in the arrangement depicted in FIG. 2, the targets 31,32,33,34 may be target diffraction gratings, for example, arranged such that the target surfaces of each lie substantially parallel to a reference plane. Furthermore, each of the displacement sensors 21,22,23,24 may include a radiation source, a reference diffraction grating and a radiation sensor. However, other arrangements are possible and within the scope of the present invention. For example, one or more of the components of the displacement sensor may be arranged separately from the substrate table. For example, the radiation source and/or the radiation sensor may be arranged separately from the substrate table 11 and arranged to provide the radiation to the reference diffraction grating or receive the radiation return from the target diffraction grating, respectively, using, for example, an optic fiber cable.

Furthermore, the target diffraction gratings may be one-dimensional diffraction gratings (namely a plurality of striations) enabling displacement measurements in the direction substantially perpendicular to the plane of the target diffraction grating and/or in a direction that lies within a plane substantially parallel to the plane of the target diffraction grating and is substantially perpendicular to the direction of the striations. Alternatively, one or more of the target diffraction gratings 31,32,33,34 may be a two-dimensional diffraction grating, enabling displacement measurements in at least one of the direction substantially perpendicular to the plane of the target diffraction grating and two orthogonal directions lying within a plane substantially parallel to the plane of the target diffraction grating. Accordingly, each of the displacement sensors 21,23,23,24 of the arrangement depicted in FIG. 2 may be configured to measure the displacement of the respective portion 11a,11b,11c,11d of the substrate table 11 relative to the reference frame 13 in one or more of a direction substantially perpendicular to the plane within which the targets 31,32,33,34 lie and two orthogonal directions lying within that plane, namely in at least one of the x, y and z directions as indicated in FIG. 2.

In a particular arrangement of the embodiment of the invention depicted in FIG. 2, the first and the third displacement sensors 21,23 are arranged to measure the displacement of the respective portions 11a,11c of the substrate table 11 relative to the reference frame in the y direction. The second and fourth displacement sensors 22,24 are configured to measure the displacement of the respective portions 11b,11d of the substrate table 11 in the x direction. Accordingly, by comparing the displacement of the first part 11a of the substrate table in the y direction with the displacement of the third part 11c of the substrate table 11 in the y direction, it is possible to determine the rotation of the substrate table 11 about the z axis. A determination of the rotation of the substrate table 11 about the z axis may also be made by comparing the measured displacement in the x direction of the second and fourth parts 11b,11d of the substrate table 11.

Determining the rotation of the substrate table 11 about the z axis is useful because it enables an accurate determination of the displacement in the x or y direction of any part of the substrate table, namely of parts not provided with a displacement sensor, for example, at a location corresponding to a point on the substrate 12 at which a pattern is being exposed. For example, the displacement in the y direction of a point of interest on the substrate table 11, may be determined by adding to the displacement measurement of the first part 11a in the y direction determined by the first displacement sensor 21, the product of the angular displacement of the substrate table 11 about the z axis and the separation in the x direction of the point of interest and the part 11a of substrate table 11. A similar calculation can be made based on the displacement measurement in the y direction measured by the third displacement sensor.

Correspondingly, the displacement in the x direction of any point of interest on the substrate table 11, can be determined using the measurement of the displacement in the x direction from either of the second and fourth displacement sensors 22,24. Accordingly, the displacement of any point on the substrate table 11 within the x-y plane can be fully determined (in other words linearly in both the x and y directions and rotationally about the z axis) using the displacement measurements from any three of the four displacement sensors 21,22, 23,24. It should be appreciated that, although the displacement sensors 21,22,23,24 are arranged towards the corners of the substrate table 11 in the arrangement depicted in FIG. 2, in general they need not be. However, the greater the separation of the displacement sensors, the greater the accuracy in the determination of the rotational displacement about the z axis and therefore the greater the accuracy of the determination of the displacement of any point on the substrate table 11. Furthermore additional sensors may be provided, for example to provide additional redundancy.

Each of the displacement sensors 21,22,23,24 may further be configured in order to measure the displacement of the respective part 11a,11b,11c,11d of the substrate table 11 relative to the associated target 31,32,33,34 in the z direction in the manner discussed above. It should be appreciated that in the same way as discussed above, comparison of the z displacement measured by pairs of displacement sensors may be used to determine the rotation of the substrate table 11 relative to the reference frame 13 rotationally about the x and y axes. In turn, these measurements may be used in order to determine the z displacement of any part of the substrate table 11. Furthermore, in the same way as described above, it is possible to measure the rotation of the substrate table 11 relative to the reference frame 13 about the x and y axes, and accordingly determine the true z displacement of any part on the substrate table 11 from any three of the four displacement sensors 21,22,23,24.

It should be appreciated that instead of constructing the displacement sensors 21,22,23,24 to measure the displacement of the respective part of the substrate table 11 relative to the associated target in both the z direction and one of the x and y directions, additional displacement sensors may be provided specifically to measure the displacement of the substrate table relative to an associated target in the z direction. The z direction displacement sensors may be positioned immediately adjacent to the x and y direction displacement sensors. Alternatively, one or more z direction displacement sensors may be provided at locations on the substrate table 11 set apart from the x and y direction displacement sensors 21,22,23,24. Furthermore, although the z direction displacement sensors may use the same targets as the x and y direction displacement sensors 21,22,23,24, alternatively or additionally, additional targets may be provided for the z direction displacement sensors.

Accordingly, it will be appreciated that with a configuration of displacement sensors as discussed above, it is possible to determine the displacement of any part of the substrate table 11 or of the substrate 12 supported on the substrate table 11, in all six degrees of freedom, using any three of the four or more displacement sensors 21,22,23,24. This ability is beneficial because, as depicted in FIG. 2, it may be desirable to have a gap 25 between the targets 31,32,33,34. The gap 25 is provided such that the inspection and/or measurement or exposure of the substrate, for example, can be performed while the displacement measurement system 10 is monitoring the displacement of the substrate table 11. Accordingly, for example, a beam of radiation 26 may need to pass through the gap 25 to pass from the projection lens or metrology system 27 to the substrate 12 in order to perform the exposure or inspection and/or measurement of the substrate 12, respectively.

However, as the substrate table 11 moves to enable different parts of the substrate 12 to be exposed, measured and/or inspected, one of the displacement sensors 21,22,23,24 may move to a position at which it cannot project radiation onto its respective target but instead projects it through the gap 25. For example, if the substrate table depicted in FIG. 2 were to be moved to its maximum point of y and its maximum point of x (corresponding to exposing, measuring or inspecting the point on the substrate 12 at the minimum x and y) the second displacement sensor 22 would not be able to project a beam of radiation onto its respective target 32 and accordingly will not function. However, it is still possible to determine the displacement of any point on the substrate table 11 or substrate 12 in all six degrees of freedom because the three remaining displacement sensors 21,23,24 are still able to function.

It should be appreciated that although the description above refers to sensors measuring the displacement of the substrate table in the x, y and z directions, embodiments of the invention are not limited to the use of displacement sensors that measure the displacement of the substrate table in these directions. In particular, one or more of the sensors, or separate, additional, sensors may measure the displacement of the substrate table in a different direction, for example at 45° to one of the x, y and z axes. Furthermore, although it may be beneficial to provide displacement sensors that measure the displacement of the substrate table in mutually orthogonal directions, this is not essential.

It should further be appreciated that FIG. 2 is schematic and not drawn to scale. In particular, the substrate table 11 and the metrology/exposure unit 27 have been depicted as being relatively distant from the targets 31,32,33,34 in the z direction. This has been done for clarity of the figure and, in practice, these components would be significantly closer together and/or the metrology/exposure unit 27 may protrude through the gap 25.

Furthermore, the size of the targets 31,32,33,34 is determined from the range of movement required for the substrate table 10. Adjacent targets may be in contact with each other or a small gap may be provided between them.

FIGS. 3a, 3b, 3c and 3d depict an arrangement of in accordance with an embodiment of the present invention. As depicted, the arrangement includes a first displacement measurement system 40 that corresponds to that of FIG. 2 discussed above. In particular, the displacement measurement system includes first, second, third and fourth targets 41,42, 43,44 mounted to a reference frame and displacement sensors 51,52,53,54 mounted to the substrate table 50 that are arranged to measure the displacement of respective portions of the substrate table 50 relative to the respective targets 41,42,43,44 and therefore the reference frame. In the arrangement depicted, the first displacement measurement system 40 is arranged such that it can measure the displacement of the substrate table 50 relative to the reference frame at all positions at which the substrate may be exposed by the exposure system 55.

The substrate table 50 may also be moved to a position in which any part of the substrate may be measured and/or inspected by a metrology unit 56. For example a substrate may be measured and/or inspected in detail by the metrology unit 56 prior to being transferred to have a pattern exposed upon it by the exposure unit 55. Accordingly, it is desirable to measure accurately the displacement of the substrate table 50 both during the process of inspection and/or measurement by the metrology unit 56, during the exposure of the pattern by the exposure unit 55 and during the transfer from one to the other. Accordingly, a second displacement measurement system 45 is provided that measures the displacement of the substrate table 50 during the inspection and/or measurement process performed by the metrology unit 56. The second displacement measurement system 45 consists of fifth, sixth, seventh and eighth targets 46,47,48,49 and the displacement sensors 51,52,53,54 used as part of the first displacement measurement system 40. In other words, some components are used in common for both the first displacement measurement system 40 and the second displacement measurement system 45.

Figure 3A:
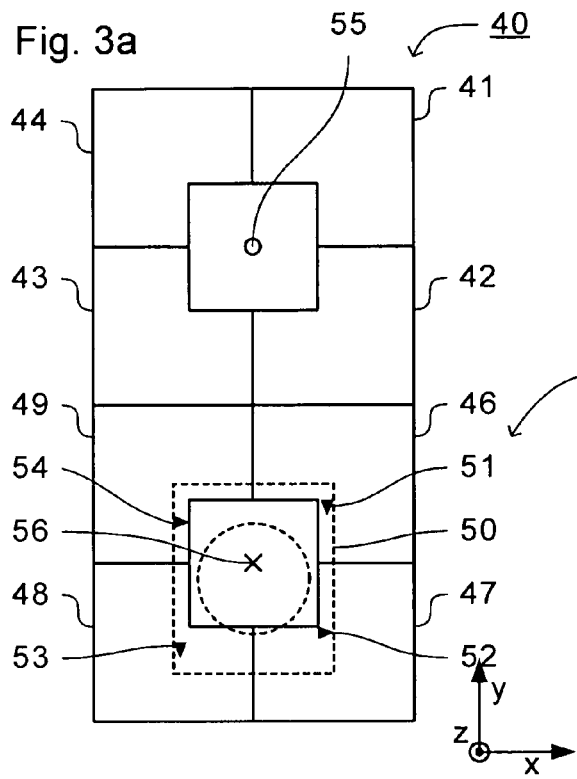
FIGS. 3a to 3f depict the arrangement of a lithographic apparatus according to an embodiment of the present invention.

As depicted in FIG. 3a, when the substrate table 50 is positioned such that the inspection and/or measurement process can be performed by the metrology unit 56, the first displacement sensor 51 is arranged to measure the displacement of the corresponding portion of the substrate table 50 relative to the fifth target 46, the second displacement sensor 52 is positioned to measure the displacement of the corresponding portion of the substrate table 50 relative to the sixth target 47, the third displacement sensor 53 is positioned to measure the displacement of the corresponding part of the substrate table 50 relative to the seventh target 48 and the fourth displacement sensor 54 is positioned to measure the displacement of the corresponding portion of the substrate table 50 relative to the eighth target 49. Accordingly, the displacement of the substrate table 50 relative to the reference frame can be accurately determined by the second displacement measurement system 45 when the substrate table 50 is positioned for performance of the inspection and/or measurement process performed by the metrology unit 56 in the same manner it can when it is positioned for exposure of the substrate by the exposure unit 55. Furthermore, the first and second displacement measurement systems 40,45 may be arranged as depicted such that for the full range of motion desired to expose the substrate and for the full range of motion desired to inspect and/or measure the substrate, at all times three of the four displacement measurement sensors 51,52, 53,54 are able to measure the displacement of the respective portion of the substrate table 50 relative to one of the targets.

Accordingly, as discussed above and as depicted, if two of the displacement sensors 51,53 are arranged to measure displacements in the y direction and two of the displacement sensors 52,54 are arranged to measure displacements in the x direction, it is possible to completely determine the displacement of any part of the substrate table 50 relative to the reference frame within the x-y plane for the full range of movement desired for the exposure process and the full range of movement desired for the inspection and/or measurement process. Furthermore, again as discussed above, if each of the displacement sensors 51,52,53,54 is further arranged to measure displacement in the z direction, it is possible to determine completely the displacement of any part of the substrate table 50 relative to the reference frame in all six degrees of freedom, again for the full range of movement desired for the exposure process and the full range of movement desired for the inspection and/or measurement process.

As depicted by the sequence of positions of the substrate table 50 in FIGS. 3a, 3b, 3c and 3d, it is also possible for the substrate table 50 to move from the inspection and/or measurement position (depicted in FIG. 3a) to the exposure position (depicted in FIG. 3d), without losing the accuracy of the measurement of the displacement. This may be a problem for displacement measurement systems having separate targets for each displacement sensor because as the substrate table 50 moves out of the range of movement required for either of the exposure process and the inspection and/or measurement process, the displacement sensors 51,52,53,54 must transfer from one target to another. At the boundary between targets, the displacement sensor will not provide a reliable displacement measurement. However, by providing a separate target for each displacement sensor in each of the metrology position and the exposure position, the size and, therefore, the cost of the targets can be kept to a minimum.

Therefore, as depicted in FIGS. 3a, 3b, 3c and 3d the displacement measurement systems may be arranged such that when one of the displacement sensors 51,52,53,54 passes a boundary between one target and the next, the remaining three displacement sensors are able to measure accurately the displacement (such that the complete displacement of the substrate table 50 can be determined as discussed above).

Figure 3B:
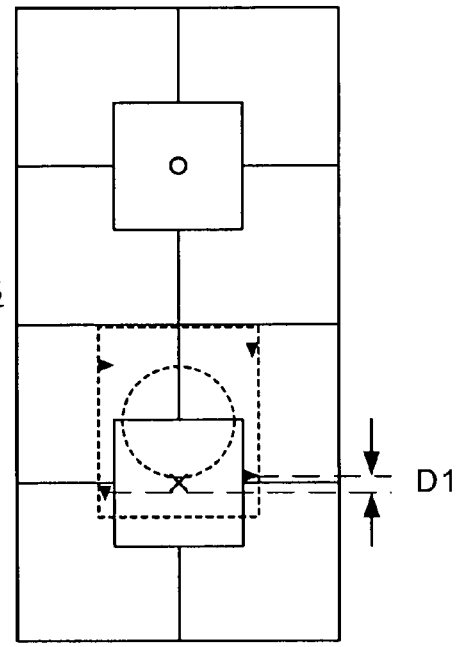
Figure 3C:
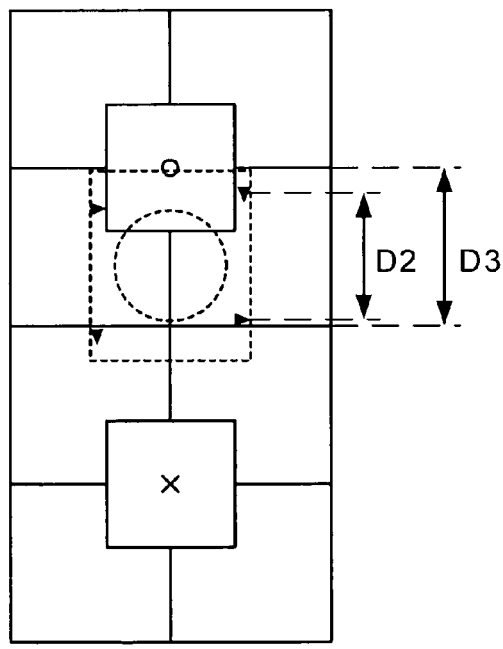
Figure 3D:
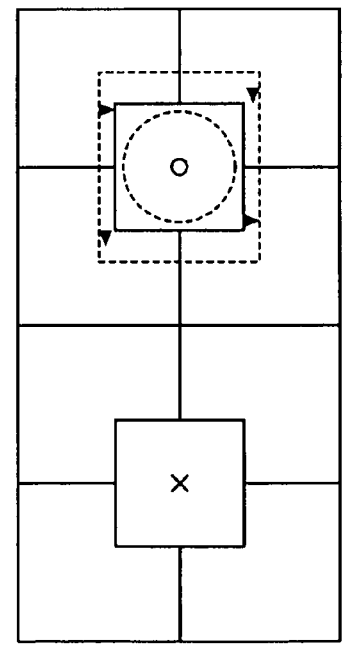

In order to achieve this, it is desirable to carefully arrange the relative position of the displacement sensors 51,52,53,54 on the substrate table 50 and the boundary between the targets. In particular, for any two displacement sensors approaching respective boundaries between targets, it is desirable that the separation between the displacement sensors in the direction of movement of the substrate table 50 be different from the separation of the boundaries in that direction. Accordingly, as depicted in FIG. 3b, for example, the separation D1 between the second and third displacement sensors 52,53 in the y direction is different from the separation, in the y direction, between the boundary between the fifth and sixth targets 46,47 and the boundary between the seventh and eighth targets 48,49 (which is zero). Therefore, as shown in FIG. 3b, the second displacement sensor 52 has completed its transfer from the sixth target 47 to the fifth target 46 before the third displacement sensor 53 commences its transfer from the seventh target 48 to the eighth target 49.

As a further example, the separation D2 in the y direction between the first and second displacement sensors 51,52 is different from the separation D3, in the y direction, between the boundary between the first and second targets 41,42 and the boundary between the second and fifth targets 42,46. Accordingly, the second displacement sensor 52 has completed its transfer from the fifth target 46 to the second target 42 before the first displacement sensor 51 commences its transfer from the second target 42 to the first target 41.

As depicted in FIGS. 3a to 3f, one possibility for ensuring that the separation between two displacement sensors in the direction of movement of the substrate table 50 is different from the separation in that direction of the respective boundaries between two targets, that the displacement sensors cross, is to arrange the displacement sensors 51,52,53,54 on the substrate table 50 at different positions in the y direction relative to a set point on the substrate table 50. Alternatively or additionally, the positions of the boundaries between respective targets may be staggered in the y direction. For example, the position in the y direction of the boundary between the first and second targets 41,42 may be different from the position in the y direction of the boundary between the third and fourth targets 43,44. Likewise, the positions in the y direction of the boundaries between the second and fifth targets 42,46 and the third and eighth targets 43,49, respectively and the positions in the y direction of the boundaries between the fifth and sixth targets 46,47 and the seventh and eighth targets 48,49, respectively, may be different.

Figure 3E:
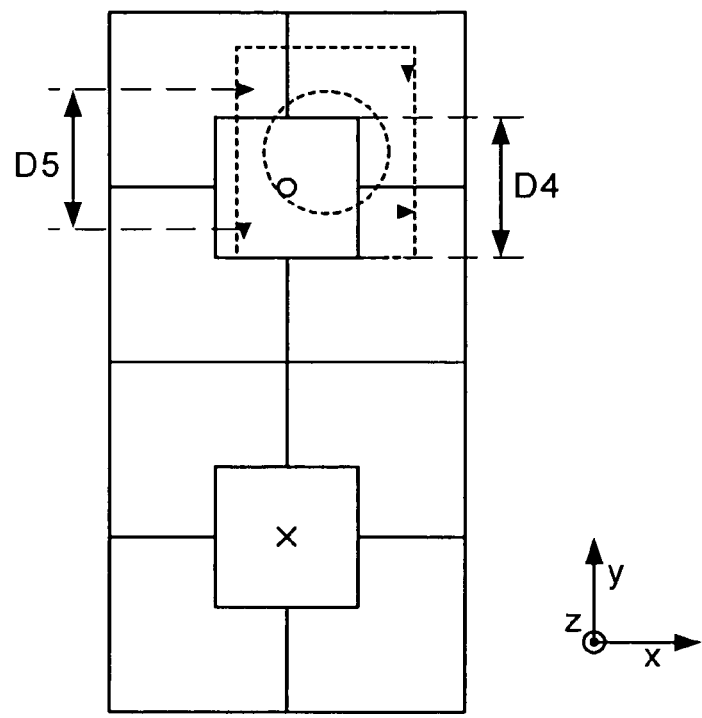
Figure 3F:
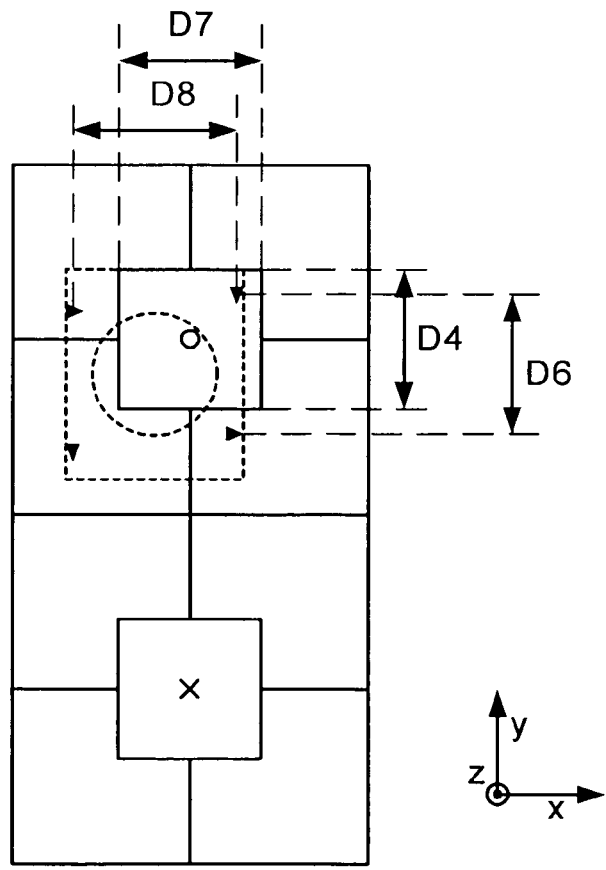

Furthermore, it should be appreciated that, as depicted in FIGS. 3e and 3f as discussed above, during the exposure process, the substrate table 50 may be moved through a range of movements within the x-y plane in order to allow the exposure unit 55 to project exposures onto any part of the substrate. During such a range of movement, at various stages one of the displacement sensors 51,52,53,54 may no longer be aligned with one of the targets 41,42,43,44 but may instead be aligned with the gap between the targets. Accordingly, it is desirable to ensure that throughout the range of movement required in the x-y plane in order to perform the exposure process, only one displacement sensor 51,52,53,54 is aligned with the gap between the targets 41,42,43,44 at any one time. In order to ensure this, in an embodiment, the length D4 of the gap between the targets 41,42,43,44 is smaller than the separation D5, D6 between pairs of sensors that are aligned in the y direction or are separated by a relatively small amount in the x direction. For example, therefore, the separation D5 between the third and fourth displacement sensors 53,54 and the separation D6 between the first and second displacement sensors 51,52 are larger than the length D4 of the gap in the y direction. Similarly, the width D7 of the gap in the x direction is smaller than the separation D8 in the x direction of pairs of displacement sensors that are aligned in the x direction or have a relatively small separation in the y direction. Accordingly, for example, the separation D8 in the x direction of the first and fourth displacement sensors 51,54 is larger than the width D7 of the gap in the x direction.

It should be appreciated that the size of the gap between the targets 46,47,48,49 of the second displacement measurement system is selected in a corresponding manner.

Figure 4A:
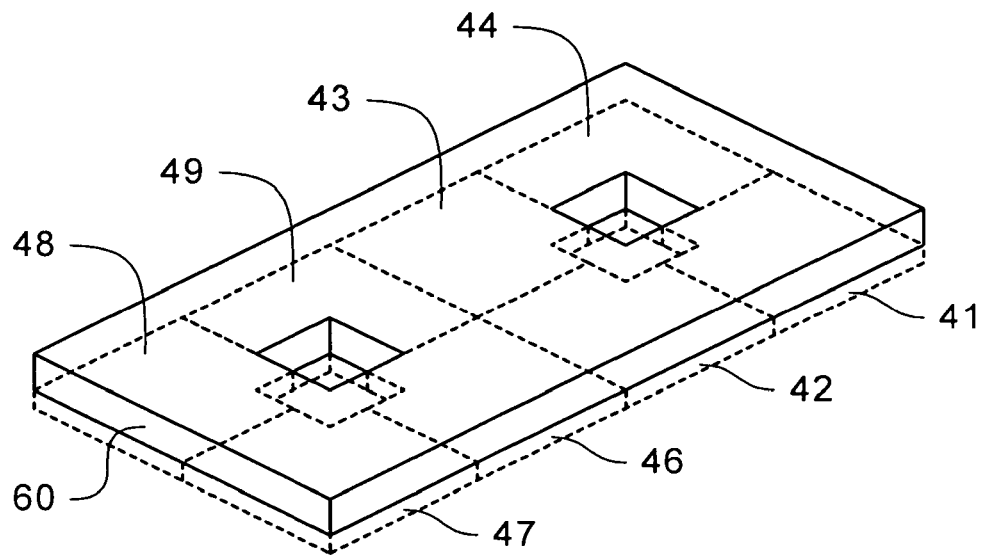
FIGS. 4a and 4b depict in more detail, variants of the arrangement depicted in FIGS. 3a to 3f.

For clarity, FIGS. 3a, 3b, 3c and 3d do not depict the reference frame. However, as schematically depicted in FIG. 4a, the first through to the eighth target may be mounted to a single reference frame 60. This may in turn be mounted to a metrology reference frame to which, for example, other components of the lithographic apparatus, such as the exposure unit, the metrology unit, or parts of either, may be mounted. The reference frame 60 may, alternatively be the metrology reference frame itself. The metrology reference frame may be mounted to the base frame of the lithographic apparatus, for example using vibration isolation supports that minimize the transmission of vibration from the base frame to the metrology reference frame.

Figure 4B:
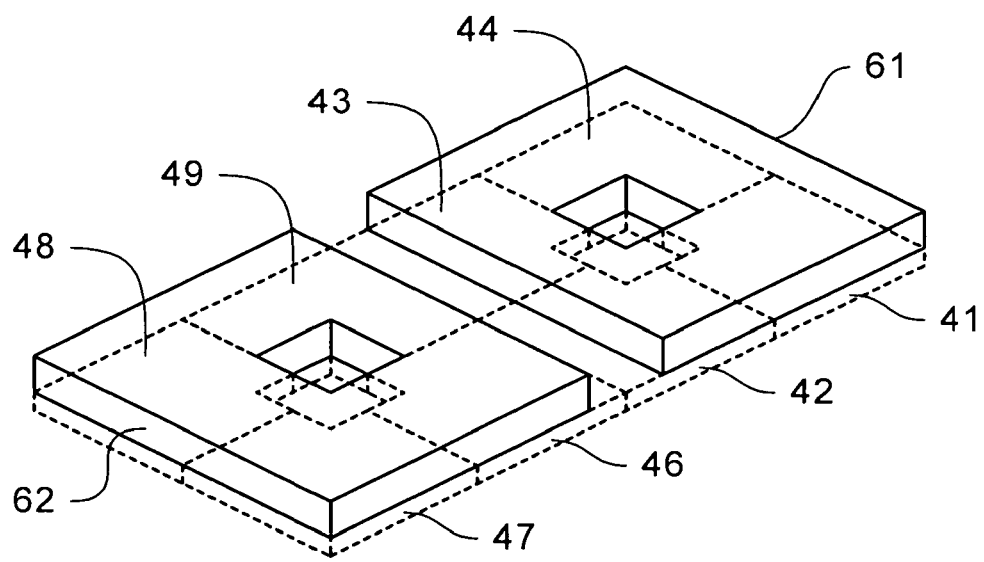

Alternatively, as depicted in FIG. 4b, the targets 41,42,43, 44 associated with the first displacement measurement system 40 may be mounted to a first reference frame 61 and the targets 46,47,48,49 associated with the second displacement measurement system 55, may be mounted to a second, separate, reference frame 62. The separate reference frames 61,62 may in turn, for example, be mounted to the metrology reference frame of the lithographic apparatus. Accordingly, the transfer of any vibrations from one of the respective reference frames to the other will be minimized, minimizing the effect on measurements made relative to the other reference frame.

It should be appreciated that other components may be mounted to the reference frames 61,62. For example, in the arrangement depicted in FIG. 4b, the exposure unit 55 or a part of it, may be mounted to the first reference frame 61. Likewise, the metrology unit 56 or a part of it may be mounted to the second reference frame 62. Accordingly, by providing separate reference frames 61,62, any vibration from the metrology unit 56, for example, will have as little effect as possible on the accuracy of the measurement of the displacement of the substrate table 50 relative to the first reference frame 61 and therefore, in turn, to the exposure unit 55.

Figure 5A:
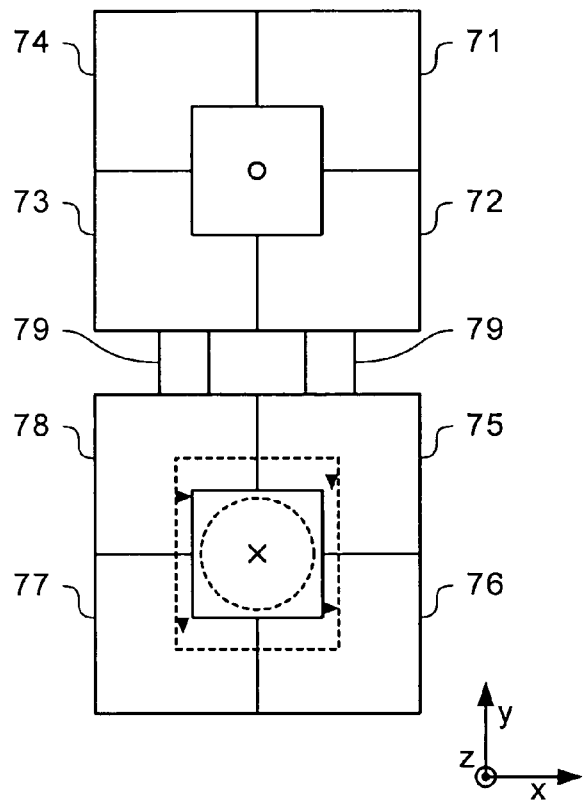
FIGS. 5a, 5b and 5c depict variants of the arrangement of the lithographic apparatus according to an embodiment.
Figure 5B:
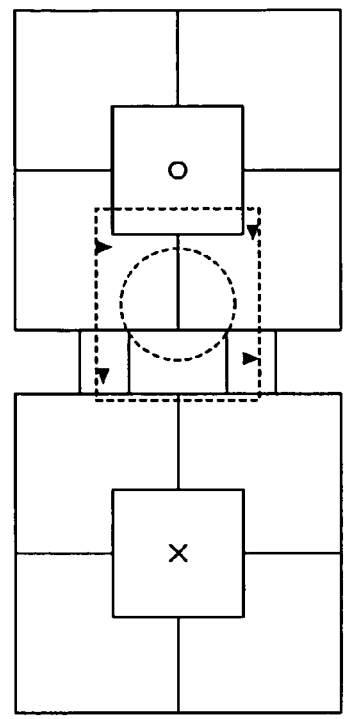

FIGS. 5a and 5b depict a variant of the arrangement depicted in FIGS. 3a to 3f. In particular, the targets 71,72,73, 74 provided for the first displacement measurement system (for use during the exposure process, for example) are set apart from the targets 75,76,77,78 provided for the second displacement measurement system (used during the metrology process). Therefore, in order to ensure that, during the transfer of the substrate table from a position, as depicted in FIG. 5a, in which metrology can be performed to a position in which an exposure can be performed, the displacement of the substrate table can be accurately determined, additional targets 79, are provided between the targets 71,72,73,74 of the first displacement measurement system and the targets 75,76, 77,78 of the second displacement measurement system. As before, the position of all of the targets and the position of the displacement sensors is arranged such that at all times at least three of the displacement sensors can provide a displacement measurement (namely is not aligned with the gap between targets or on the boundary between targets). Therefore, it will be appreciated that the separation between the exposure unit and the metrology unit can be increased, providing additional space for other components, without increasing the maximum size of the targets (and therefore the cost) and without reducing the accuracy of the measurement of the displacement of the substrate table relative to the reference frame(s).

Figure 5C:
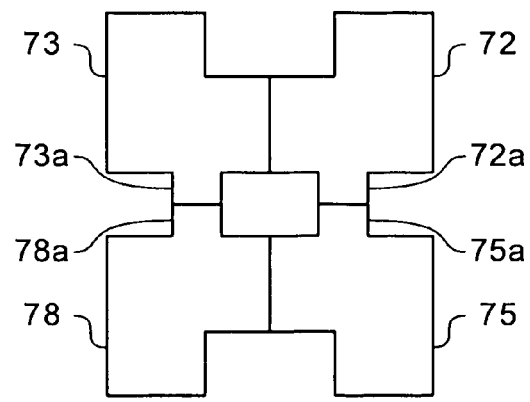

It should be appreciated that one or more of the additional targets 79 may be replaced by the provision of extensions to one or more of the second, third, fifth and eighth targets 72,73,75,78. For example, as depicted in FIG. 5c, which shows a portion of the first and second displacement measurement systems, the second target 72 may have an extension 72a that extends towards the fifth target 75 and share a boundary with an extension 75a of the fifth target. Likewise, the third and eighth targets 73,78 may have respective extensions 73a,78a that extend towards each other and share a boundary.

Where additional targets 79 are provided between the targets 71,72,73,74 of the first displacement measure system and the targets 75,76,77,78 of the second displacement measurement system, the additional targets 79 may be mounted to the same common reference frame as the targets of the first and second displacement measurement systems if a common reference frame is used for the target of both displacement measurement systems (in a manner corresponding to that depicted in FIG. 4A). In an arrangement in which separate reference frames are used for the targets of the first and second displacement measurement systems, respectively, the additional targets 79 may be mounted to either reference frame or some of the additional targets 79 may be mounted to one reference frame and others mounted to the other reference frame. Alternatively, in either case, the additional targets 79 may be mounted to an entirely separate reference frame to the reference frame(s) provided for the targets of the first and second displacement measurement systems or may be mounted directly to a metrology reference frame of the lithographic apparatus.

FIGS. 6a, 6b, 6c, 6d, 6e and 6f depict a system according to an embodiment of the present invention. Much of the arrangement corresponds to the embodiment as depicted in FIGS. 3a, 3b, 3c and 3d and, accordingly, common features have been designated with the same reference numerals and detailed description thereof will not be repeated. It should also be appreciated that variations discussed above in relation to previous discussed embodiments may also be applied to the third embodiment.

The difference between the embodiment shown in FIGS. 6a-f and the embodiments shown in FIG. 3a-d is that a second substrate table 80 is provided. The second substrate table 80 may be identical to the first substrate table 50 and includes displacement sensors 81,82,83,84. The benefit of such a system is that while a pattern is being exposed on one substrate supported on one of the substrate tables by the exposure unit 55, a second substrate, supported on the other of the substrate tables may be being inspected and/or measured by the metrology unit 56. Accordingly, the throughput of the apparatus can be increased.

The second substrate table 80 functions in the same manner as the first substrate table 50. Accordingly, the displacement sensors 81,82,83,84 of the second substrate table 80 may measure displacements relative to the first, second, third and fourth targets 41,42,43,44, functioning as the first displacement measurement system 40 and can measure displacements relative to the fifth, sixth, seventh and eighth targets 46,47, 48,49, to function as the second displacement measurement system 45.

Figure 6A:
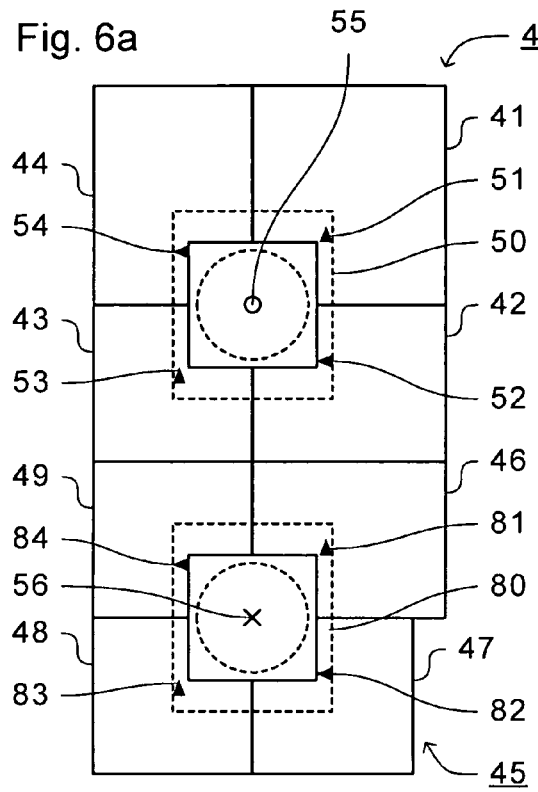
FIGS. 6a to 6f depict an arrangement of a lithographic apparatus according to an embodiment of the present invention.
Figure 6B:
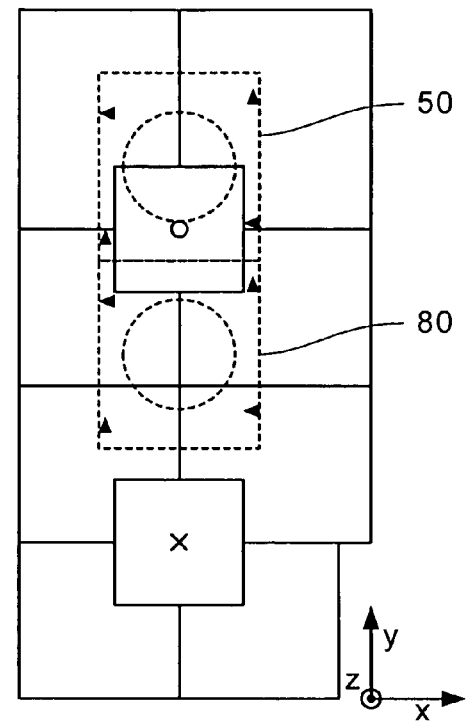
Figure 6C:
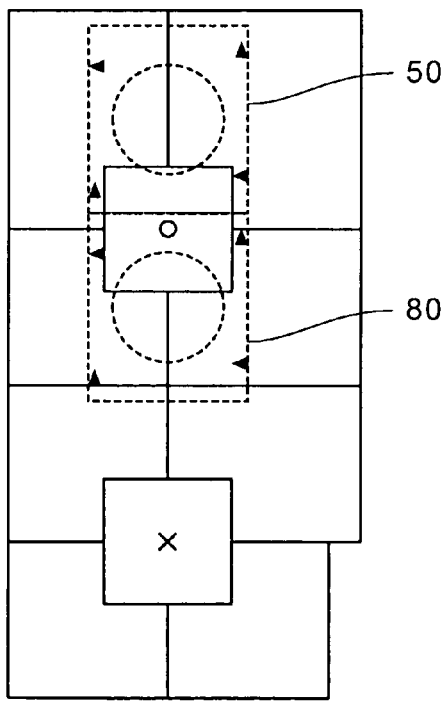
Figure 6D:
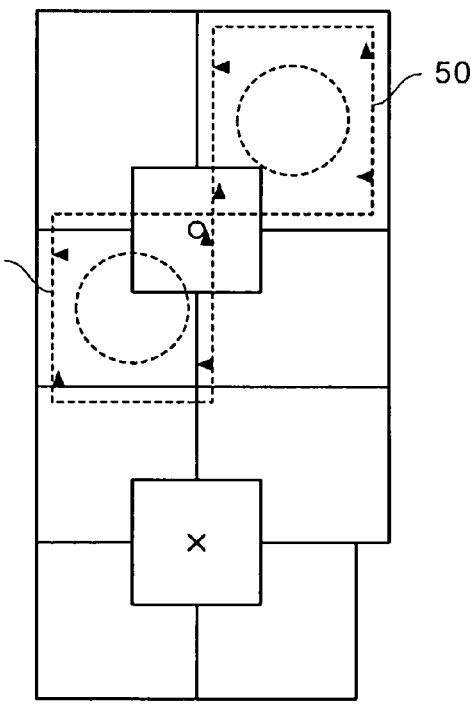
Figure 6E:
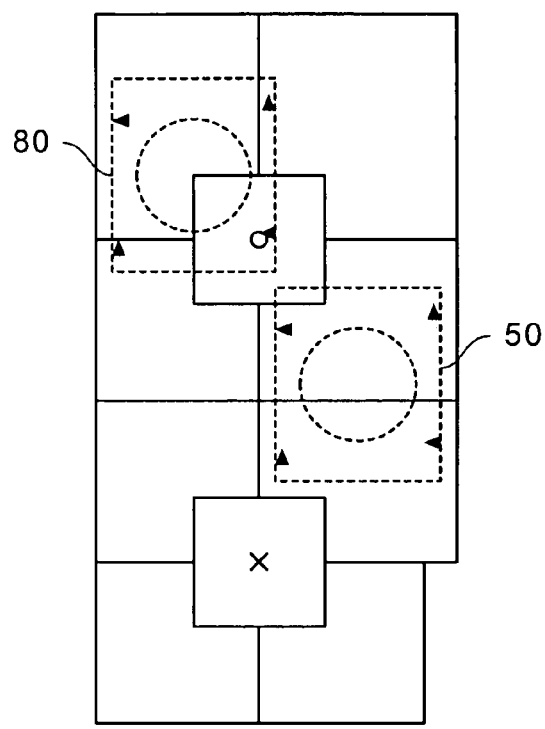
Figure 6F:
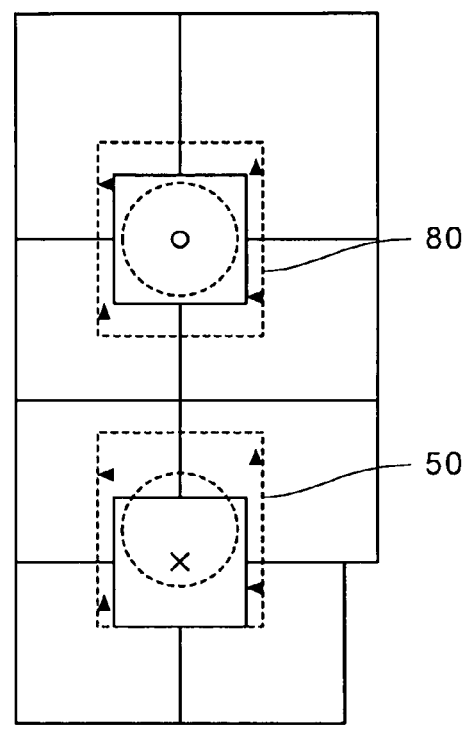

However, as depicted in FIGS. 6*a*, 6*b*, 6*c* and 6*d*, in order to ensure that the first and second substrate tables 50,80 can swap positions, namely the first substrate table 50 can move from the exposure position as depicted in FIG. 6*a* toward the metrology position as depicted in FIG. 6*f* (from where it may be moved to a position at which, as discussed further below, a substrate may be unloaded from the substrate table and a new substrate loaded to the substrate table and moved to the metrology position such that the new substrate can be inspected and/or measured using the metrology unit 56), and the second substrate table 80 can move from the metrology position as depicted in FIG. 6*a* to the exposure position as depicted in FIG. 6*f* (and back again) without more than one of the displacement sensors on each of the substrate tables being unable to provide a displacement measurement, thereby preventing a complete determination of the displacement of the associated substrate table 50,80, it is desirable to enlarge some of the targets 41,42,46. This increases the cost of the targets because the larger a target is, the more difficult it is to manufacture to the required accuracy across its entire range, and therefore the more expensive the target is.

Furthermore, the size of some targets 41,44 may need to be increased if the lithographic apparatus is a so-called immersion lithographic apparatus. In such an apparatus, the exposure of a pattern of radiation on the substrate is performed through a layer of liquid. This enables higher performance of the lithographic apparatus. In order to provide and control the application of the liquid, the exposure unit 55 includes a showerhead that provides liquid to the portion of the substrate in which the exposure is being performed and removes the liquid at the edges. One of the difficulties in such a system includes the starting and stopping of the showerhead. Therefore, it is desirable to provide a lithographic apparatus in which the showerhead does not need to be stopped and started between the exposure of subsequent substrates. This may be achieved, for example, by the use of a so-called "wet swap". The arrangement depicted in FIGS. 6*a* to 6*f* provides for such a wet swap.

As depicted in FIG. 6*b*, a part of the swap process includes the first and second substrate tables 50,80 moving to respective positions such that they are immediately adjacent each other, for example touching or very close in the y direction. As depicted in FIG. 6*b*, the first and second substrate tables 50,80 may be aligned but this is not essential. Subsequently, the first and second substrate tables 50,80 move in unison in the y direction such that the point of contact between the exposure unit 55, namely the showerhead, moves from the first substrate table 50 to the second substrate table 80. As the first and second substrate tables 50,80 are very close or touching, the showerhead need not be turned off as it transfers from the first substrate table 50 to the second substrate table 80. After the transfer has been completed as depicted in FIG. 6*c*, the substrate tables 50,80 can move apart, as depicted in FIG. 6*d* and then move in opposite senses in the y direction, for example, as depicted in FIG. 6*e* to a position such that, as depicted in FIG. 6*f*, the first substrate table 50 can move toward the metrology position and its displacement can be measured by the second displacement measurement system and the second substrate table 80 can move to the exposure position and its displacement can be measured using the first displacement measurement system. Once the respective exposure and metrology processes are completed, the process can be repeated to swap the substrate tables back again.

As depicted in FIGS. 6*a* to 6*f*, in switching the second substrate table 80 from the metrology position to the exposure position, the first and second substrate tables 50,80 move about each other in a clockwise fashion. As discussed above, in order to switch the substrates back, such that the first substrate table 50 returns from the metrology position to the exposure position, the process may be repeated. However, the substrate tables 50,80 may include umbilical connections to provide, for example, power and communications between devices such as the displacement sensors included in the substrate table and components, such as control systems, in the remainder of the lithographic apparatus. Accordingly, in order to avoid the requirement for a complicated system for connecting the umbilicals, the process for swapping the substrate tables 50,80 back, namely returning the first substrate table 50 to the exposure position and the second substrate table 80 to the metrology position, may differ from the changeover of the substrate tables 50,80 depicted in FIGS. 6*a* to 6*f* in that the substrate tables may move about each other in an anti-clockwise direction. Accordingly, to move the second substrate table 80, from the metrology position to the exposure position, the substrate tables 50,80 rotate clockwise about each other and to return the first substrate table 50 to the exposing position, the substrate tables rotate about each other in an anti-clockwise direction (or vice versa). In such an arrangement, it is straight forward to ensure that that the umbilicals or other connections to the substrate tables do not interfere with one another.

After completion of an exposure process on a substrate, the substrate table supporting that substrate is, as discussed above, returned towards the metrology position and then to a substrate unloading position at which the substrate is unloaded from the substrate table and subsequently to a substrate loading position at which a new substrate is loaded to the substrate table. The substrate table is then moved such that the measurement and/or inspection process can be performed on the new substrate by the metrology unit.

The substrate unloading position and the substrate loading position may be selected such that the substrate table remains within the region in which the second displacement measurement system 45 can measure the displacement of the substrate table during the substrate unloading and substrate loading operations. Accordingly, the movement towards the substrate unloading position, the movement from the substrate unloading position to the substrate loading position and the movement from the substrate loading position to the position at which the inspection and/or measurement process is performed may be controlled using the measurements of the displacement of the substrate table measured by the second displacement measurement system 45.

The substrate unloading position and the substrate loading position may be arranged adjacent to each other at an extreme edge of the area within the second displacement measurement system can measure the displacement of the substrate table. For example, they may be arranged such that, for each, the substrate table is at its furthest position in the negative y direction as depicted in FIGS. 6a to 6f. Robot wafer handlers may be provided to unload substrates from the substrate table and load substrates on to the substrate table, respectively. However, the robot wafer handlers may move relatively slowly and, as a consequence, may, for some time after a substrate has been removed from the substrate table, be in a position that interferes with the operation of the second displacement measurement system. For example a robot wafer handler may prevent one or more of the displacement sensors from projecting a beam of radiation onto an associated target. Accordingly, in order to ensure that the displacement of the substrate table can be measured at all times during the movement from the substrate unloading position to the substrate loading position, it may be desirable, instead of moving the substrate table directly from the substrate unloading position to the substrate loading position, to move the substrate table directly away from the robot wafer handler before moving it across and then advancing directly towards the substrate loading position. For example, in an arrangement as depicted in FIGS. 6a to 6f in which the substrate unloading position and substrate loading position are provided at the edge furthest towards the negative y direction of the second displacement measurement apparatus, the substrate table may be advanced initially in the positive y direction away from the substrate unloading position, moved substantially parallel to the x direction and then advanced in the negative y direction to the substrate loading position. In this manner, it may be possible to continuously measure the displacement of the substrate table during the movement from the substrate unloading position to the substrate loading position because, for example, none of the displacement sensors cross a boundary between targets while the robot wafer handler is obscuring the operation of one of the displacement sensors.

FIGS. 7a to 7h depict a lithographic apparatus according to an embodiment of the present invention. As with the embodiments shown in FIGS. 6a-f, this configuration includes first and second displacement measurement systems to measure the displacement of a substrate table in the exposing position and metrology position, respectively. In addition, the apparatus includes two substrate tables 50,80 such that one substrate, supported on a first substrate table 50 may be exposed while a second substrate, supported on a second substrate table 80, may be inspected and/or measured by a metrology unit. Like components are designated with the same reference numerals as used in respect of the previous embodiments and only the differences thereof will be discussed. It will be appreciated that variants discussed above in relation to the first to third embodiments may also be applied to the embodiments shown in FIGS. 7a-h.

As with the embodiments shown in FIGS. 6a-f, the first stage in the process to change over the positions of the first and second substrate tables 50,80 is the transfer of the second substrate table 80 to the exposure position, as depicted in FIGS. 7b and 7c. As before, the changeover may be used in a lithographic apparatus in which an immersion exposure is used and a wet swap, moving in the y direction may be used to transfer the showerhead from the first substrate table 50 to the second substrate table 80 without switching off the immersion shower. However, unlike the arrangement of the third embodiment, the targets 41,42,43,44 are not increased in size. In other words, the target 41,42,43,44 of the first displacement measurement system 40 are only as big as is necessary in order to provide the range of motion desired of the substrate table 50 during an exposure process. Accordingly, as the wet swap proceeds, as depicted in FIG. 7b, the first and fourth displacement sensors 51,54 of the first substrate table 50, pass beyond the boundary of the first and fourth targets 41,44, respectively. Therefore, according to the fourth embodiment, further targets, 91,92 are provided for the first and fourth displacement sensors 51,54 of the first substrate table 50 to use to measure the displacement of the substrate table 50. Likewise, as successively depicted in FIGS. 7c to 7g, further targets 93,94,95,96 are provided to enable measurement of the displacement of the first substrate table 50 to be continuously performed even though the first substrate table 50 moves well clear of the second substrate table 80 which is in the exposure position and, accordingly, the first and second displacement sensors 51,52 of the first substrate table,50 cannot measure displacements relative to the targets used for the first and second displacement measurement systems 40,45. Accordingly, during the changeover procedure as depicted in FIGS. 7a to 7h, the displacement of the first substrate table 50 is measured by a third displacement measurement system that includes the displacement sensors 51,52,53,54 of the first substrate table 50 and a plurality of targets, including some of those used in the first and second displacement measurement systems 44,45 as well as the additional targets 91,92,93,94,95,96.

The position of the additional targets 91,92,93,94,95,96 (targets 91 and 92 not shown in FIG. 7c) may be specially selected in order to ensure that at all times a sufficient number of displacement sensors are aligned with respective targets that the displacement of the substrate table can always be determined. For example, the position of the additional target 95 that is set apart from the targets of the first and second displacement measurement systems 44,45 in the x direction, is elongate in the y direction and used to provide a target for the first and second displacement sensors 51,52 of a substrate table during the movement of a substrate table from the exposure position towards the metrology position after the wet-swap has been completed, may be carefully selected. In particular, it may be positioned such that, while the first and second displacement sensors 51,52 are aligned with the elongate additional target 95, the third and fourth displacement sensors 53,54 may be aligned with the first and/or second target 41,42 of the first displacement measurement system without passing over the gaps between the targets 41,42,43,44 of the first displacement measurement system as the substrate table 50 is moved in the y direction.

Likewise, the boundaries between the additional targets 91,92,93,94,95,96 and any other targets may be positioned such that for the intended movement of the substrate table, the separation in a given direction of movement between any pair of displacement sensors on the substrate table in the direction of movement is different to the separation in that direction of the respective boundaries between two targets approached by those displacement sensors during the intended movement. Accordingly, it is possible to ensure that, at any one time, only one displacement sensor is crossing a boundary between two targets and unable to provide a reliable displacement measurement.

In order to minimize the size of the targets used, in particular the additional targets, the arrangement may be configured such that at times during the transfer of the first substrate table 50 from the exposure position to the metrology position, only two of the displacement sensors are able to measure displacements (the remaining two either not being aligned to a target or being aligned with the boundary between two targets). Accordingly, in order to ensure that at all times the third displacement measurement system is able to determine the displacement of the substrate table 50 in all six degrees of freedom, one or more of the displacement sensors may be modified such that it can measure displacements of the corresponding portion of the substrate table in both the x and y directions, if the apparatus only functions in the x-y plane, and the z direction if the apparatus monitors the displacement in all six degrees of freedom, for example. Accordingly, it remains possible to determine completely the displacement of the substrate table 50, to the desired extent, even if only two of the displacement sensors are able to measure displacements, provided one of those two sensors is one of the modified sensors.

In such a modified system, if it is desirable to determine the rotation of the substrate table about the x and y axes, for example, in order to determine the precise displacement in the z direction of the points of the substrate table other than those at which the displacement sensors are located, then the modified sensor also includes a second point of measurement of the displacement in the z direction, set apart from the original point of measurement of the z displacement within that sensor. However, due to the limited size of the displacement sensors, the separation is relatively small and, accordingly, any angular displacement determined by a comparison of the two z displacement measurements, may be less accurate than the angular displacement that can be determined by comparing z displacement measurements from two separate displacement sensors.

It should be appreciated, however, that in returning the substrate table from the exposure position toward the metrology position and thence to the substrate unload/load positions (which may be within the area within which the second displacement measurement system operates, namely the metrology position), it may not be important to measure the displacement as accurately as during movement during a metrology operation, movement from the metrology position to the exposure position and the movement during an exposure process. This is especially true because the substrate may be removed from the substrate table immediately after the return of a substrate table toward the metrology area. Accordingly, the potential drawbacks discussed above may prove not to be consequential. Furthermore, it should be appreciated that if the required accuracy of the third displacement measurement system, returning a substrate table from the exposure position to the measuring position is not as high as the first and second displacement measurement positions, used for measuring the displacement of the substrate table during exposure and metrology processes, respectively, the desired accuracy of the additional targets 91,92,93,94,95,96 used solely for the third displacement measurement system, may not be as high as the accuracy requirements for the targets used in the first and second displacement measurement systems. Accordingly, less expensive targets may be used.

For simplicity, the arrangement depicted in FIGS. 7a to 7h, only depicts the additional targets used to swap over the first and second substrate tables 50,80 in a clockwise fashion. As discussed above in relation to the embodiments of FIGS. 6a-f, in order to switch the substrate table back, namely from the arrangement depicted in FIG. 7h, to return the first substrate table 50 to the exposure position, the substrate tables may be successively swapped in a clockwise fashion as depicted in FIGS. 7a to 7h. Alternatively, as discussed above, the apparatus may be configured such that the changeovers of the substrate table can be alternately clockwise and anti-clockwise in order to avoid conflict between, for example, umbilical connections to the substrate tables. In order to provide such an arrangement, a complimentary set of additional targets should be provided (not shown in the figures) on the opposite side of the targets used for the first and second displacement measurement systems to the additional targets 93,94,95,96 shown in FIGS. 7a to 7h.

FIGS. 8a to 8h depict a variation of the embodiments shown in FIGS. 7a-h. Much of the variant is the same as the arrangement depicted in FIGS. 7a to 7h and only the differences thereof will be discussed. Likewise, the same reference numerals are used to designate common parts.

Figure 8C:
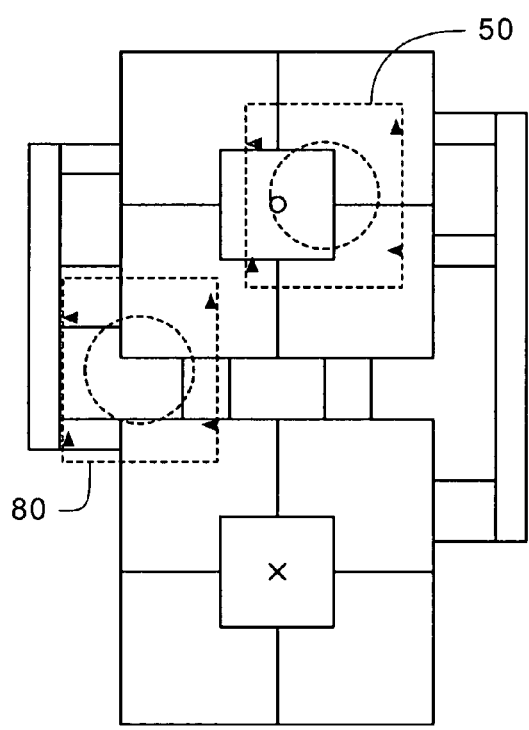
Figure 8D:
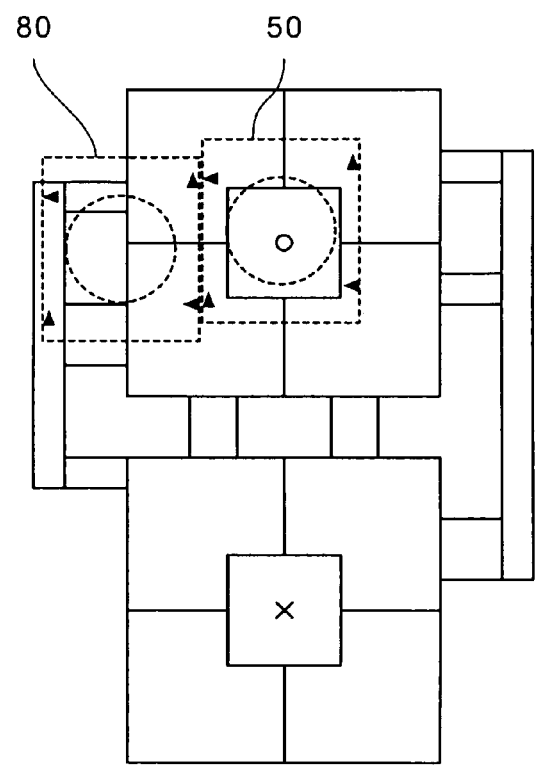
Figure 8E:
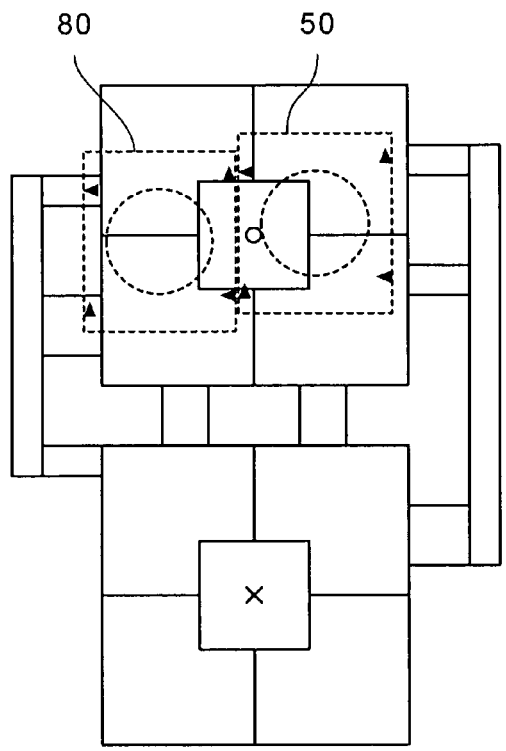
Figure 8F:
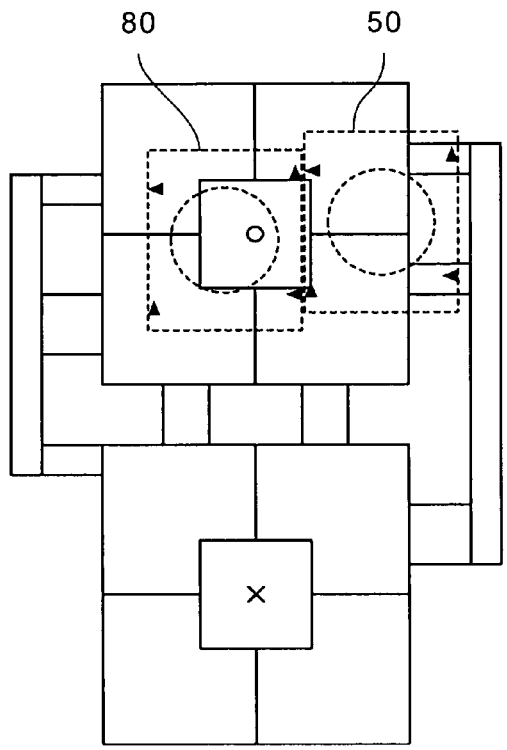
Figure 8G:
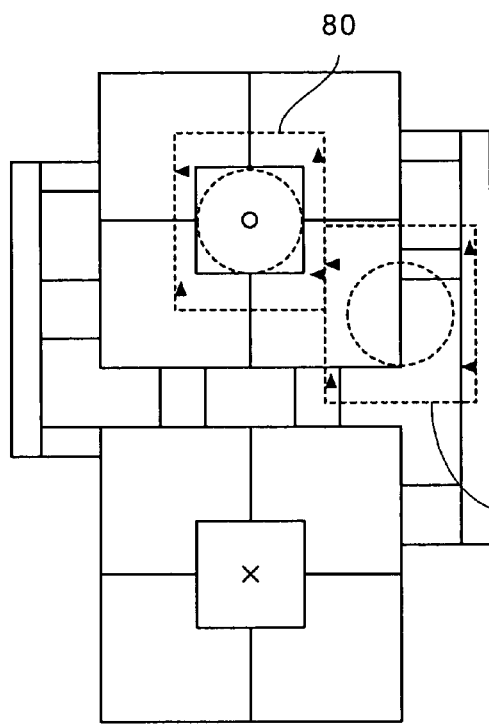
Figure 8H:
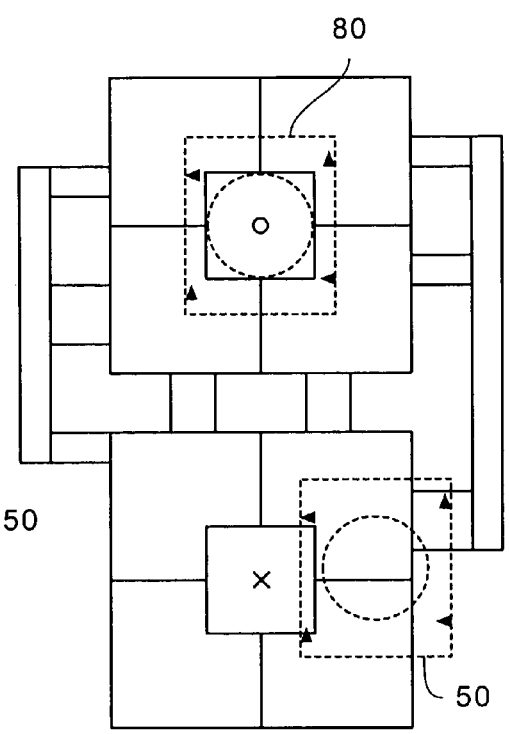

The primary difference between the arrangement depicted in FIGS. 7a to 7h and the arrangement depicted in FIGS. 8a to 8h is that, as depicted in FIGS. 8d, 8e and 8f, the wet swap process, during which the immersion showerhead transfers from the first substrate table 50 to the second substrate table 80, is performed with the first and second substrate table 50,80 moving in unison in the x direction instead of the y direction. In order to provide this arrangement, additional targets 100,101,102,103 are provided in order to measure accurately the displacement of the second substrate table 80 as it moves into position for the wet swap and additional targets 104,105,106,107 are desired in order to measure accurately the displacement of the first substrate table 50 as it moves from the wet swap out of the way of the second substrate table 80 and returns to the metrology position whereupon its displacement can again be measured by the second displacement measurement system 45. Accordingly, as with the arrangement depicted in FIGS. 7a to 7h a third displacement measurement system is provided using a combination of additional targets 100,101,102,103,104,105,106, 107 and targets that are also used for the first and second displacement measurement systems.

As with the arrangement depicted in FIGS. 7a to 7h, the position of the additional targets 100,101,102,103,104,105, 106,107 of the arrangement depicted in FIGS. 8a to 8h may be selected to ensure that at all times a sufficient number of displacement sensors are aligned with respective targets that the displacement of the substrate table can be determined. For example, the boundaries between each of the additional targets 100,101,102,103,104,105,106,107 and any other target may be positioned such that, for any intended movement of the table, the separation between any pair of displacement sensors on the substrate table in the direction of movement is different to the separation in that direction of the respective boundaries between two targets approached by the displacement sensors in the intended movement. In addition, the size and position of the additional targets 100,101,102,103,104, 104,106,107 may be selected to ensure that at any position of the substrate table during its intended movement, only one displacement sensor is aligned above a gap between targets.

In relation to the embodiments shown in FIGS. 8a-h, the displacement measurement system may be able to measure the displacement of the substrate tables as accurately as that of the first and second displacement measurement systems 40,45, at least during the process of transferring a substrate table from the metrology area to the exposure area. However, it is only desirable to accurately measure the overall displacement from the metrology area to the exposure area. Accordingly, the accuracy requirement for the third displacement measurement system to measure portions of the displacement may be relaxed, provided the end point of the displacement can be accurately determined relative to the start point.

It should be appreciated that variations discussed above in relation to FIGS. 7a to 7h may also be applied to the arrangement depicted in FIGS. 8a to 8h. In particular, it should also be appreciated that the additional targets depicted in FIGS. 8a to 8h are only those that are used in order to perform a clockwise swap of the substrate tables. If it is intended to provide alternate clockwise and anti-clockwise swaps of the first and second substrate tables 50,80, additional targets can be provided.

Although in FIGS. 7a to 8h, the additional targets used solely for the third displacement measurement systems have been depicted as a plurality of separate targets, it should be appreciated that in either of the variants depicted, any two of the additional targets may be combined to form a single additional target.

Figure 9C:
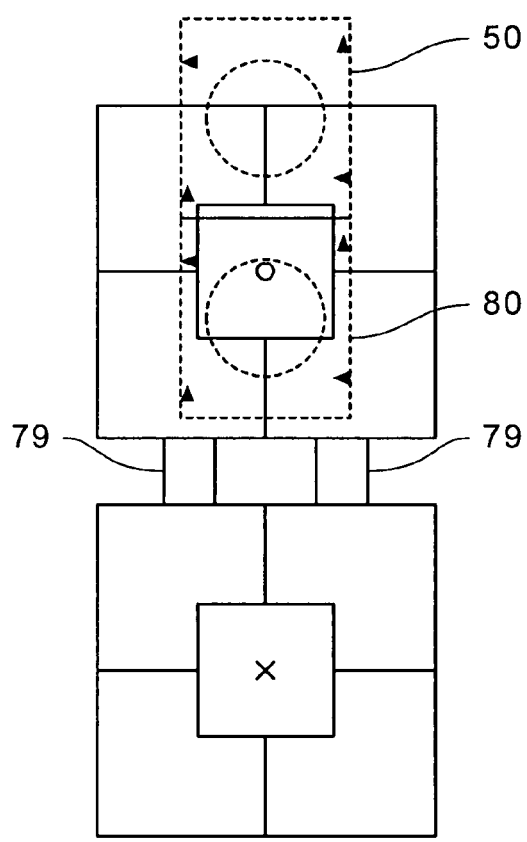
Figure 9D:
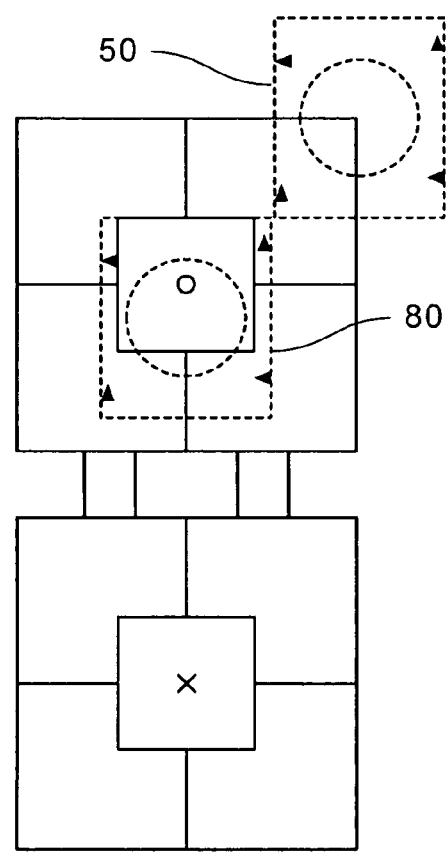
Figure 9E:
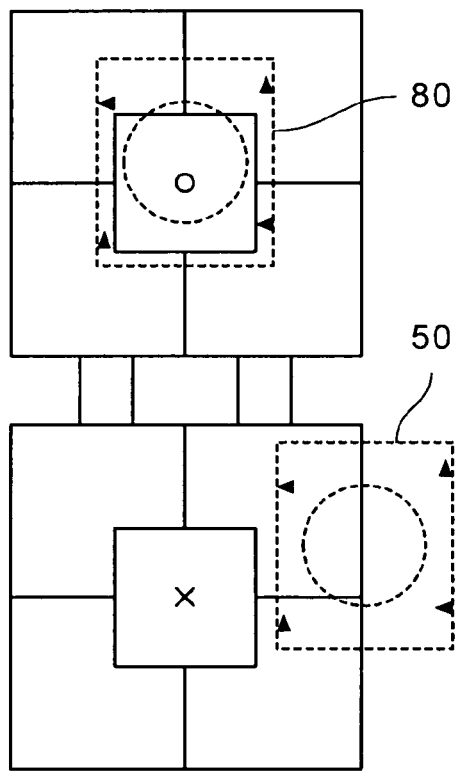
Figure 9F:
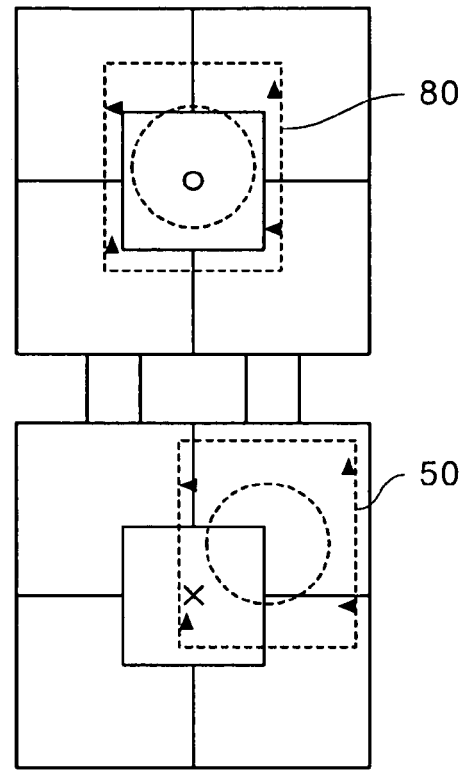

FIGS. 9a to 9h depict the operation of a lithographic apparatus according to an embodiment of the present invention. As with the embodiments shown in FIGS. 6a-f and FIGS. 7a-h, the apparatus includes first and second substrate tables 50,80 and first and second displacement measurement systems 40,45 arranged to measure the displacement of the substrate tables 50,80 in the exposure and metrology areas, respectively. As depicted in FIGS. 9b and 9c, a wet swap in the y direction is provided to transfer the immersion showerhead from the first substrate table 50 to the second substrate table 80. Thereafter, the displacement of the second substrate table 80 may be determined using the first displacement measurement system 40. As depicted in FIGS. 9d and 9e, the first substrate table 50 moves beyond the control of the first displacement system 40 and is returned toward the metrology position from where it may be moved to substrate unload and substrate loading positions in turn.

As depicted in FIGS. 9d and 9e, during the return movement of the first substrate table 50 an insufficient number of the displacement sensors may be able to determine the displacement of the substrate table. Accordingly, the first and second displacement measurement systems may not provide sufficient accuracy in order to control the movement of the substrate table. Therefore a third displacement measurement system is provided that measures the position of the substrate table relative to the base frame of the lithographic apparatus, instead of relative to the reference frame, using, for example, an incremental rule or any other suitable displacement sensor.

It should be appreciated that the third displacement measurement system may be significantly less accurate than the first and second displacement measurement systems. This is because the first and second displacement measurement systems measure the displacement of the substrate table relative to, for example, the reference frame which is mounted to the base frame by means of vibration isolators that minimise the transfer of vibrations from the base frame to the reference frame. In contrast, the third displacement measurement system measures the displacement of the substrate table directly relative to the base frame. Accordingly, any vibrations transferred to the base frame of the lithographic apparatus by other components will reduce the accuracy of the displacement measurement. However, because the system is only used after the exposure on the substrate has been completed, highly accurate control of the displacement of the substrate table is not required. Instead, as provided by the arrangement depicted in FIGS. 9a to 9h, the second displacement measurement system measures the displacement of a substrate table highly accurately during the metrology process, the substrate table then is transferred to the exposure area in the manner discussed above in relation to the second, third and fourth embodiments, for example using additional targets 79, such that the displacement of that substrate table continues to be measured highly accurately and, subsequently, the displacement of the substrate table is measured highly accurately using the first displacement measurement system 40, until the exposure process is completed.

As depicted in FIG. 9g, the third displacement measurement system may be sufficiently accurate in order to return the first substrate table 50 to a position in which the exposed substrate may be unloaded from the substrate table 50. Thereafter, as depicted in FIG. 9h, the first substrate table 50 may be transferred to a position at which a new substrate may be loaded to the substrate table. Before the metrology process can be performed on a substrate, it may be desirable to accurately determine the absolute position of the substrate table on which the substrate is loaded relative to the targets of the second displacement measurement system. Accordingly, it is desirable to use a position measurement system to measure the absolute position of the substrate table relative to the reference frame. Once the absolute position of the substrate table relative to the reference frame has been determined, continual measurements of the displacement of the substrate table using the first and second displacement measurement systems can be used to determine the position of the substrate table at all times until the exposure is completed.

The position measurement system used to measure the absolute position of the substrate table relative to the reference frame may be a position measurement system such as that disclosed in U.S. Pat. No. 6,875,992 which is incorporated herein by reference. In such a position sensor, a radiation source is mounted on the reference frame and directs a beam of radiation to a reflector mounted on the substrate table that is constructed to reflect light emitted from the radiation along a return path that is parallel to, but displaced from, the incident light path. The amount of displacement is dependent on the position of the substrate table and is measured by a two-dimensional radiation detector mounted adjacent to the radiation source. Three such devices may be combined in a system in order to measure the position of the substrate table in all six degrees of freedom. However, this process may take some time, reducing the throughput of the apparatus. For example, the overall TACT time of the apparatus may be 7 seconds and the time taken to determine the position of the substrate table may be 0.3 seconds. Accordingly, delaying the apparatus in order to measure the position of the substrate table by this amount of time represents a significant throughput penalty.

However, according to a particular embodiment of the present invention, the position sensor used to determine the absolute position of the substrate table relative to the targets of the second displacement measurement system may be configured such that the position measurement can be performed while the substrate is being loaded to the substrate table. Accordingly, no time and accordingly no throughput is lost. Furthermore, such an arrangement may be beneficial compared to an arrangement such as discussed above in relation to the embodiments of FIGS. 6a-f and 7a-h, in which the displacement of the substrate table is continuously measured using a high accuracy measurement system and in which the absolute position of the substrate table is not determined during the normal processing cycle. This is because in such an arrangement, the substrate table may need to remain motionless after the substrate has been unloaded from the substrate table before the substrate table can be moved to the substrate loading position because the substrate handler may for some time prevent the displacement sensors from being able to measure displacements relative to the target. This problem is obviated in the embodiments shown in FIGS. 9a-h because the absolute position of the substrate table is determined each time the substrate table is moved to the substrate load position. Consequently, any inaccuracies in the movement of the substrate table from the unload position to the load position are not relevant and there is no requirement to hold the substrate table at the substrate unload position until the wafer handler has cleared the space between the displacement sensors and the targets.

It should be appreciated that the procedure of measuring the position of the substrate table relative to the reference frame during the procedure to load a substrate to the substrate table may be used in conjunction with any of the embodiments of the invention discussed above. In particular, it may be especially useful in relation to the embodiments of FIGS. 7a-h if the third displacement measurement system is not as accurate as the first and second displacement measurement system.

It will further be understood that as with the embodiments of FIGS. 6a-f and 7a-h, the embodiments of FIGS. 9a-h may straightforwardly be arranged such that the first and second substrate tables 50,80 are repeatedly swapped by a clockwise exchange or may also be arranged to swap alternately by clockwise and anti-clockwise exchanges.

Although specific reference may be made in this text to the use of lithographic apparatus in the manufacture of Ics, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A displacement measurement system configured to measure a displacement of a component relative to a reference component, comprising:

first, second, third and fourth targets, each mounted to the reference component and arranged such that a target surface of each target is substantially parallel to a reference plane; and first, second, third and fourth displacement sensors, each arranged to measure the displacement of a respective part of the component relative to the target surface of a respective target;

wherein said first and third displacement sensors are configured to measure the displacement of first and third parts of the component relative to the target surfaces of said first and third targets, respectively, along a direction substantially parallel to a first direction that lies within said reference plane, wherein said second and fourth displacement sensors are configured to measure the displacement of second and fourth parts of the component relative to the target surfaces of said second and fourth targets, respectively, along a direction substantially parallel to a second direction that lies within said reference plane and is substantially orthogonal to said first direction, and wherein at least one of said first, second, third and fourth displacement sensors is further configured to measure a displacement of the respective part of the component relative to the respective target surface along a direction that is substantially parallel to a third direction that is substantially orthogonal to said first and second directions.

2. A lithographic apparatus comprising:

a first displacement measurement system configured to measure a displacement of a substrate table constructed to support a substrate relative to a reference component, comprising:

first, second, third and fourth targets, each mounted to the reference component and arranged such that a target surface of each target is substantially parallel to a reference plane; and first, second, third and fourth displacement sensors, each arranged to measure the displacement of a respective part of the substrate table relative to the target surface of a respective target;

wherein said first and third displacement sensors are configured to measure the displacement of first and third parts of the substrate table relative to the target surfaces of said first and third targets, respectively, along a direction substantially parallel to a first direction that lies within said reference plane, wherein said second and fourth displacement sensors are configured to measure the displacement of second and fourth parts of the substrate table relative to the target surfaces of said second and fourth targets, respectively, along a direction substantially parallel to a second direction that lies within said reference plane and is substantially orthogonal to said first direction, wherein said first displacement measurement system is arranged to measure the displacement of the substrate table relative to the reference component at least during a process to transfer a pattern onto the substrate; and a second displacement measuring system that is arranged to measure the displacement of the substrate table relative to the reference component at least during a process to perform one or more measurements and inspections of the substrate prior to the process to transfer the pattern onto the substrate, said second displacement measuring system comprising:

fifth, sixth, seventh and eighth targets, each mounted to the reference component and arranged such that a target surface of each target is substantially parallel to said reference plane; and the first, second, third and fourth displacement sensors of the first displacement measurement system;

wherein said first and third displacement sensors are configured to measure the displacement of the first and third parts of the substrate table relative to the target surfaces of the fifth and seventh targets, respectively, along a direction substantially parallel to said first direction; and wherein said second and fourth displacement sensors are configured to measure the displacement of the second and fourth parts of the substrate table relative to the target surfaces of the sixth and eighth targets, respectively, along a direction substantially parallel to said second direction.

3. The lithographic apparatus according to claim 2, wherein the first and second displacement measurement systems are arranged such that as the substrate table moves from a metrology position, in which the second displacement measurement system measures the displacement of the substrate table relative to said reference component, to a pattern transfer position, in which the first displacement measurement system measures the displacement of the substrate table relative to said reference component, at all times at least three of the first, second, third and fourth displacement sensors are able to measure the displacement of the substrate table relative to the target surface of a target.

4. The lithographic apparatus according to claim 3, wherein the first and second displacement measurement systems are arranged such that a separation of any pair of displacement sensors in a direction of movement of the substrate table, that is substantially parallel to said reference plane, is different from a separation, in said direction of movement, of a pair of boundaries between adjacent targets that are to be crossed by said displacement sensors, respectively, during a movement of the substrate table in said direction of movement.

5. The lithographic apparatus according to claim 2, further comprising one or more additional targets, each mounted to the reference component between the targets of the first and second displacement systems and such that a target surface of each of said one or more additional targets is substantially parallel to said preference plane, wherein the lithographic apparatus is arranged such that during a movement of the substrate table between a metrology position in which the second displacement measurement system measures the displacement of the substrate table relative to said reference component, and a pattern transfer position, in which the first displacement measurement system measures the displacement of the substrate table relative to said reference component, at least one of the first, second, third and fourth displacement measurement sensors is configured to measure a displacement of the respective part of the substrate table relative to the target surface of one of said one or more additional targets.

6. The lithographic apparatus according to claim 2, further comprising:

a second substrate table constructed to support a substrate, and fifth, sixth, seventh and eighth displacement sensors, each arranged to measure a displacement of a respective part of the second substrate table relative to the target surface of the first, second, third and fourth targets, respectively, or the fifth, sixth, seventh and eighth targets, respectively, in a manner corresponding to the measurements of the first, second, third and fourth parts of the first substrate table by the first, second, third and fourth displacement sensors, respectively.

7. The lithographic apparatus according to claim 2, further comprising a third displacement measuring system arranged to measure a displacement of the substrate table relative to the reference component during at least a part of a substrate table return movement of the substrate table from a pattern transfer position, in which the first displacement measurement system measures the displacement of the substrate table relative to said reference component, to an unload position, at which a substrate is unloaded from the substrate table.

8. The lithographic apparatus according to claim 7, wherein the third displacement measurement system comprises at least one substrate table return target, each mounted to the reference component and arranged such that a target surface of the at least one substrate table return target is substantially parallel to said reference plane; and wherein the first, second, third and fourth displacement measurement sensors are arranged such that during said at least part of a substrate table return movement of the substrate table, at least one of the first, second, third and fourth displacement measurement sensors is capable of measuring the displacement of the respective part of the substrate table relative to the target surface of one of said at least one substrate table return target.

9. The lithographic apparatus according to claim 8, wherein at least one of the first, second, third and fourth displacement sensors is constructed so as to measure a displacement of the respective part of the substrate table relative to the target surface of a target, along directions substantially parallel to the both the first and second directions.

10. The lithographic apparatus according to claim 7, wherein the targets of the first and second displacement measurement systems are mounted to a metrology reference frame such that the first and second displacement measurement systems measure the displacement of the substrate table relative to the metrology reference frame, and the third displacement measuring system measures the displacement of the substrate table relative to a base frame of the lithographic apparatus.

11. The lithographic apparatus according to claim 10, further comprising a position measurement system constructed to measure a position of the substrate table relative to the reference component after completion of the substrate table return movement.

12. The lithographic apparatus according to claim 11, wherein the position measurement system is arranged to measure the position of the substrate table relative to the reference component while a substrate is being loaded to the substrate table.

13. The lithographic apparatus according to claim 7, wherein said first and second displacement measuring systems are constructed so as to measure a displacement of the substrate table relative to the reference component to a greater accuracy than the third displacement measuring system.

14. The lithographic apparatus according to claim 2, further comprising a first and second reference frames, each individually mounted to said reference component;
   wherein said first, second, third and fourth targets are mounted to said first reference frame, and said fifth, sixth, seventh and eighth targets are mounted to said second reference frame.

15. The lithographic apparatus according to claim 2, wherein said reference component is a metrology reference frame.

16. The lithographic apparatus according to claim 2, wherein at least one of said first, second, third and fourth displacement sensors is further configured to measure a displacement of the respective part of the substrate table relative to the surface of the fifth, sixth, seven and eighth target, respectively, along a direction substantially parallel to a third direction that is substantially orthogonal to said first and second directions.

17. A lithographic apparatus, comprising:
   a substrate table constructed to support a substrate;
   a first displacement measuring system configured to measure a displacement of the substrate table relative to a reference component during a process to transfer a pattern onto the substrate, the first displacement measuring system comprising at least one target mounted to the reference component and at least one displacement sensor configured to measure the displacement of at least a part of the substrate table relative to the at least one target; and
   a second displacement measuring system configured to measure a displacement of the substrate table relative to a base frame of the lithographic apparatus, at least during a part of a substrate table return movement, in which the substrate table is moved from a position at which the pattern is transferred to the substrate, to an unload position, at which a substrate is unloaded from the substrate table,
   wherein at least one of the displacement sensor of the first displacement measuring system and the displacement sensor of the second displacement measuring system is configured to measure the displacement of the substrate table along a direction parallel to a surface of the corresponding target and along a direction substantially perpendicular to said surface.

18. The lithographic apparatus according to claim 17, wherein the reference component is mounted to the base frame of the lithographic apparatus with one or more vibration isolation supports.

19. The lithographic apparatus according to claim 17, further comprising a position measurement system constructed to determine a position of the substrate table relative to the reference component after completion of the substrate table return movement.

20. The lithographic apparatus according to claim 19, wherein the position measurement system is arranged to measure the position of the substrate table relative to the reference component while a substrate is being loaded to the substrate table.

21. A method of measuring a displacement of a component relative to a reference component, the method comprising:
   measuring a displacement of a respective part of the component relative to a target surface of a first, second, third and fourth target using first, second, third and fourth displacement sensors, respectively, the first, second, third and fourth targets mounted to the reference component and arranged such that the target surface of each of said first, second, third and fourth targets is substantially parallel to a reference plane;
   wherein said first and third displacement sensors measure a displacement of the first and third parts of the component relative to the target surface of the first and third targets, respectively, along a direction substantially parallel to a first direction that lies within said reference plane,
   wherein said second and fourth displacement sensors measure a displacement of the second and fourth parts of the component relative to the target surfaces of the second and fourth targets, respectively, along a direction substantially parallel to a second direction that lies within said reference plane and is substantially orthogonal to said first direction, and
   wherein at least one of said first, second, third and fourth displacement sensors is further configured to measure a displacement of the respective part of the component relative to the respective target surface alone a direction that is substantially parallel to a third direction that is substantially orthogonal to said first and second directions.

22. A device manufacturing method comprising:
   transferring a pattern from a patterning device onto a substrate, and
   measuring a displacement of a substrate table that supports the substrate during the transferring using the method of claim 21.

23. A device manufacturing method comprising:
   transferring a pattern from a patterning device onto a substrate, the substrate being supported on a substrate table during the transferring;
   measuring a displacement of the substrate table relative to a reference component during said transferring using a displacement measuring system comprising at least one target mounted to the reference component and at least one displacement sensor, the at least one displacement sensor configured to measure the displacement of at least a part the substrate table relative to the at least one target; and
   measuring a displacement of the substrate table relative to a base frame of the lithographic apparatus, at least during a part of a substrate table return movement, in which the substrate table is moved from a position in which the pattern is transferred onto the substrate, to an unload position, at which the substrate is unloaded from the table,
   wherein at least one of the displacement sensor of the first displacement measuring system and the displacement sensor of the second displacement measuring system is configured to measure the displacement of the substrate table along a direction parallel to a surface of the corresponding target and along a direction substantially perpendicular to said surface.

* * * * *